United States Patent
Matsumoto et al.

(10) Patent No.: US 8,196,014 B2
(45) Date of Patent: *Jun. 5, 2012

(54) CHECK MATRIX GENERATING DEVICE, CHECK MATRIX GENERATING METHOD, ENCODER, TRANSMITTER, DECODER, AND RECEIVER

(75) Inventors: Wataru Matsumoto, Tokyo (JP); Rui Sakai, Tokyo (JP); Hideo Yoshida, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 218 days.

This patent is subject to a terminal disclaimer.

(21) Appl. No.: 12/667,002

(22) PCT Filed: Jun. 26, 2008

(86) PCT No.: PCT/JP2008/001673
§ 371 (c)(1),
(2), (4) Date: Feb. 19, 2010

(87) PCT Pub. No.: WO2009/004773
PCT Pub. Date: Jan. 8, 2009

(65) Prior Publication Data
US 2010/0211846 A1    Aug. 19, 2010

(30) Foreign Application Priority Data
Jun. 29, 2007 (JP) ................................ 2007-172542

(51) Int. Cl.
*H03M 13/00* (2006.01)
(52) U.S. Cl. ....................................... 714/758; 714/752
(58) Field of Classification Search .................. 714/752, 714/758
See application file for complete search history.

(56) References Cited

U.S. PATENT DOCUMENTS

| 7,600,173 B2 | 10/2009 | Matsumoto |
| 2007/0277082 A1 | 11/2007 | Matsumoto |

FOREIGN PATENT DOCUMENTS

| EP | 1 715 588 A1 | 10/2006 |
| WO | WO 2006/057879 A1 | 6/2006 |
| WO | WO 2006/106841 A1 | 10/2006 |
| WO | WO-2007/072721 A1 | 6/2007 |

OTHER PUBLICATIONS

Marc Fossorier, "Quasi-Cyclic Low Density Parity Check Codes", ISIT 2003, Yokohama, Japan, Jun. 29-Jul. 4, 2003, p. 150.

Marc Fossorier, "Quasi-Cyclic Low-Density Parity-Check Codes From Circulant Permutation Matrices", IEEE Transactions on Information Theory, vol. 50, No. 8, Aug. 2004, pp. 1788-1793.

Niitsuma et al., "Exercises for Introduction to Group, Ring and Field", Kyoritu Shuppan Co., Ltd., pp. 23-25.

(Continued)

*Primary Examiner* — Sam Rizk
(74) *Attorney, Agent, or Firm* — Birch, Stewart, Kolasch & Birch, LLP

(57) ABSTRACT

When arranging J cyclic permutation matrices $I(p_{j,l})$ with p rows and q columns ($0 \leq j \leq J-1, 0 \leq l \leq L-1$) in a row direction and also arranging L cyclic permutation matrices $I(p_{j,l})$ in a column direction so as to generate a regular quasi-cyclic matrix having uniform row and column weights, a quasi-cyclic matrix generating unit 31 configures the regular quasi-cyclic matrix by combining cyclic permutation matrices $I(p_{j,l})$ in each of which matrix elements whose row number is r ($0 \leq r \leq p-1$) and whose column number is $(r+p_{j,l})$ mod p are "1"s, and other matrix elements are "0"s in such a way that a plurality of cyclic permutation matrices $I(p_{j,l})$ arranged at, e.g., the 1st row differ from one another.

17 Claims, 5 Drawing Sheets

OTHER PUBLICATIONS

"Rate-compatible LDPC codes with low complexity encoder & decoder. R1-051383" 3rd Generation Partnership Project (3GPP); Technical Specification Group (TSG) Radio Access Network (RAN); WorkingGroup 1 (WG1) Seoul, Korea, XX, XX, No. R1-051383, Nov. 7, 2005, XP003024532.

Kim J et al.; "Quasi-Cyclic LDPC Codes for Fast Encoding" IEEE Transactions on Information Theory, IEEE, US, vol. 51, No. 8, Aug. 1, 2005, pp. 2894-2901, XP011136337.

Kim, S.; No, J.-S; Chung, H.; Shin, D.-J.; "On the girth of tanner (3, 5) quasi-cyclic LDPC codes" Information Theory, IEEE Transactions on, vol. 52, No. 4 Apr. 1, 2006, pp. 1739-1744, XP 002593673.

Nonary B et al.; "Construction of well-structured quasi-cyclic low-density parity check codes Capacity approaching codes design and implementation" IEEE Proceedings: Communications, vol. 152, No. 6, Dec. 9, 2005, pp. 1081-1085, XP006025745 Institution of Electrical Engineers, GB.

CHECK MATRIX GENERATING DEVICE, CHECK MATRIX GENERATING METHOD, ENCODER, TRANSMITTER, DECODER, AND RECEIVER

FIELD OF THE INVENTION

The present invention relates to an encoding technology for use in digital communications. More particularly, it relates to a check matrix generating device for and a check matrix generating method of generating a parity check matrix used for LDPC (Low-Density Parity Check) codes, an encoder for and a transmitter for encoding predetermined information bits by using a parity check matrix, and a decoder for and a receiver for decoding predetermined information bits by using a parity check matrix.

BACKGROUND OF THE INVENTION

Hereafter, a conventional communications system which employs an LDPC code will be explained as an encoding system.

Hereafter, it is assumed that the conventional communications system uses a quasi-cyclic (QC: Quasi-Cyclic) code as an example of an LDPC code (refer to the following nonpatent reference 1).

First, a flow of an encoding process and a decoding process which are carried out by the conventional communications system will be explained briefly.

An LDPC encoder mounted in a communication device on a transmit side (referred to as a "transmitter" from here on) generates a parity check matrix H (which will be mentioned below in detail).

The LDPC encoder also generates, for example, a generator matrix G with K rows and N columns (K: an information length, N: a codeword length).

In this case, when the parity check matrix for LDPC is expressed as H (with M rows and N columns), the generator matrix G satisfies $GH^T=0$ (T denotes the transposed matrix).

When receiving a message $(m_1, m_2, \ldots, m_K)$ having the information length K, the LDPC encoder generates a codeword C from the message $(m_1, m_2, \ldots m_K)$ by using the generator matrix G generated previously, as shown in the following equation (1). In this case, $H(c_1, c_2, \ldots, c_N)^T=0$ is assumed.

$$C = (m_1, m_2, \ldots, m_K)G \qquad (1)$$
$$= (c_1, c_2, \ldots, c_N)$$

After the LDPC encoder generates the codeword C, a modulator of the transmitter carries out digital modulation of the codeword C by using a predetermined modulation method (e.g., BPSK (Binary Phase Shift Keying), QPSK (Quadrature Phase Shift Keying), or multiple value QAM (Quadrature Amplitude Modulation)), and transmits the modulated signal $x=(x_1, x_2, \ldots, x_N)$ to a communication device on a receive side (referred to as a "receiver" from here on).

It is assumed that in an error occurs in the modulated signal $x=(x_1, x_2, \ldots, x_N)$ transmitted from the transmitter during transmission through the radio channel, and the signal including the error is received by the receiver.

When receiving the modulated signal $y=(y_1, y_2, \ldots, y_N)$ including the error, the demodulator of the receiver performs digital demodulation according to the modulation method, such as BPSK, QPSK, or multiple value QAM, on the modulated signal $y=(y_1, y_2, \ldots, y_N)$.

When receiving the demodulated result of the demodulator, the LDPC decoder of the receiver performs iterative decoding according to the "sum-product algorithm" on the demodulated result so as to decode the demodulated result into the message $(m_1, m_2, \ldots, m_K)$ having the information length K, and then outputs the message $(m_1, m_2, \ldots, m_K)$.

Hereafter, the parity check matrix for LDPC code will be explained concretely.

For example, in the following nonpatent reference 1, a parity check matrix $H_{QC}$ for QC codes as shown in FIG. 6 is proposed as a parity check matrix for LDPC code.

The parity check matrix $H_{QC}$ for QC code as shown in FIG. 6 is the one in which cyclic permutation matrices (p=5) each with five rows and five columns are arranged in a vertical direction (J=3) and in a horizontal direction (L=5).

Generally, a parity check matrix $H_{QC}$ for a (J,L)-QC code with M (=pJ) rows and N (=pL) columns can be defined as shown in the following equation (2).

[Equation 1]

$$H_{QC} = \begin{bmatrix} I(p_{0,0}) & I(p_{0,1}) & \cdots & I(p_{0,L-1}) \\ I(p_{1,0}) & I(p_{1,1}) & \cdots & I(p_{0,L-1}) \\ \vdots & \vdots & \ddots & \vdots \\ I(p_{J-1,0}) & I(p_{J-1,1}) & \cdots & I(p_{0,L-1}) \end{bmatrix} \qquad (2)$$

$$\text{Example: } p = 5, I(0) = \begin{bmatrix} 1 & 0 & 0 & 0 & 0 \\ 0 & 1 & 0 & 0 & 0 \\ 0 & 0 & 1 & 0 & 0 \\ 0 & 0 & 0 & 1 & 0 \\ 0 & 0 & 0 & 0 & 1 \end{bmatrix}.$$

where p is an odd prime number, L is the number of cyclic permutation matrices arranged in the horizontal direction (column direction) in the parity check matrix $H_{QC}$, and J is the number of cyclic permutation matrices arranged in the vertical direction (row direction) in the parity check matrix $H_{QC}$.

In each cyclic permutation matrix $I(p_{j,l})$, at $0 \leq j \leq J-1$ and $0 \leq l \leq L-1$, matrix elements whose row number is r ($0 \leq r \leq p-1$) and whose column number is $(r+p_{j,l})$ mod p are "1"s, and other matrix elements are "0"s.

"A mod B" is a mathematical symbol for calculating the remainder of the division of A by B.

Because a degradation of the performance is typically caused in case in which there exist many loops having a short length when designing an LDPC code, it is necessary to increase the girth and lessen the number of loops (loop 4, loop 6, and so on) having a short length.

FIG. 7 is an explanatory drawing showing an example of the check matrix expressed in a form of a Tanner graph.

In the parity check matrix H with M rows and N columns having two elements {0, 1}, a node corresponding to each column is referred to as a bit node $b_n$ ($1 \leq n \leq N$) (corresponding to ○ in FIG. 7) and a node corresponding to each row is referred to as a check node $c_m$ ($1 \leq m \leq M$) (corresponding to □ in FIG. 7).

Furthermore, when "1" is located at an intersection of a row and a column of the check matrix, a bipartite graph connecting between the bit node and the check node with a branch is referred to as a Tanner graph.

Each above-mentioned "loop" shows a closed loop starting from a specific node (corresponding to ○ or □ of FIG. 7) and ending at the node, as shown in FIG. 7.

The above-mentioned "girth" means a minimum loop.

The length of each loop is expressed by the number of branches configuring the closed loop, and each loop is simply expressed as loop 4, loop 6, loop 8, or . . . according to the length of each loop.

The following nonpatent reference 1 shows that the girth g in the parity check matrix $H_{QC}$ for (J,L)-QC LDPC codes falls within a range of "$4 \leq g \leq 12$ (g is an even number)".

It is easy to prevent the parity check matrix from having a girth g=4, and, in many cases, the parity check matrix has a girth satisfying $g \geq 6$.

[Nonpatent reference 1] M. Fossorier "Quasi-Cyclic Low Density Parity Check Code" ISIT2003, pp. 150, Japan, Jun. 29-Jul. 4, 2003.

Because the conventional encoder is configured as mentioned above, a parity check matrix $H_{QC}$ having a girth g falling within a range of "$4 \leq g \leq 12$ (g is a even number)" is generated, while no design method of designing a parity check matrix under the conditions that it satisfies $g \geq 6$, $g \geq 8$, $g \geq 10$, $g \geq 12$, or . . . has not been disclosed. A problem is therefore that when designing an LDPC code, it is necessary to make a search using a computer, or the like to generate a parity check matrix $H_{QC}$, and it takes much time to acquire an LDPC code.

A further problem is that because the conventional encoder lacks in extensibility, and also lacks in the regularity among cyclic permutation matrices, the complexity increases at a time when the conventional encoder is implemented, and any evidence that the results of a search using a computer are optimal cannot be established.

The present invention is made in order to solve the above-mentioned problems, and it is therefore an object of the present invention to provide a check matrix generating device, a check matrix generating method, an encoder, a transmitter, a decoder, and a receiver which can easily generate a parity check matrix having good performance and regularity.

DISCLOSURE OF THE INVENTION

In accordance with the present invention, there is provided a check matrix generating device in which a quasi-cyclic matrix generating means configures a regular quasi-cyclic matrix by combining cyclic permutation matrices in each of which matrix elements whose row number is r ($0 \leq r \leq p-1$) and whose column number is $(r+p_{j,l})$ mod p are "1"s, and other matrix elements are "0"s in such a way that a plurality of cyclic permutation matrices arranged at a specific row differ from one another.

According to the present invention, when generating the regular quasi-cyclic matrix, the quasi-cyclic matrix generating means configures the regular quasi-cyclic matrix by combining cyclic permutation matrices in each of which matrix elements whose row number is r ($0 \leq r \leq p-1$) and whose column number is $(r+p_{j,l})$ mod p are "1"s, and other matrix elements are "0"s in such a way that a plurality of cyclic permutation matrices arranged at a specific row differ from one another. Therefore, the present invention offers an advantage of being able to easily generate a parity check matrix having good performance and regularity.

PREFERRED EMBODIMENTS OF THE INVENTION

Hereafter, in order to explain this invention in greater detail, the preferred embodiments of the present invention will be described with reference to the accompanying drawings.

Embodiment 1

Figure 1:
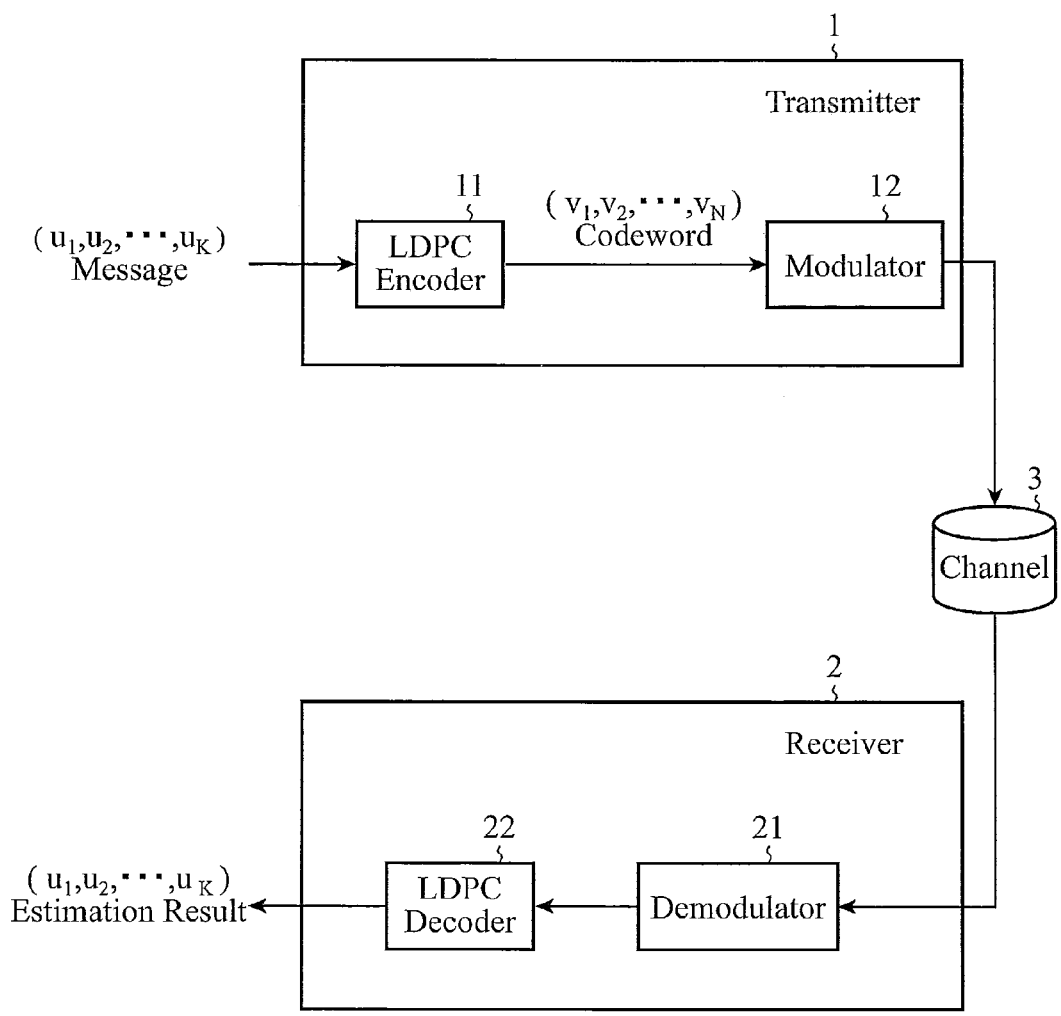
FIG. 1 is a block diagram showing a transmitter and a receiver in accordance with Embodiment 1 of the present invention.

FIG. 1 is a block diagram showing a transmitter and a receiver in accordance with Embodiment 1 of the present invention. In the figure, the transmitter 1 is comprised of an LDPC encoder 11 (encoder) and a modulator 12, and is a communication device disposed on a transmit side, for encoding a message ($u_1, u_2, \ldots, u_K$) having an information length K and transmitting this message via a channel 3.

The receiver 2 is comprised of a demodulator 21 and an LDPC decoder 22 (decoder), and is a communication device disposed on a receive side, for receiving the modulated signal transmitted from the transmitter 1, and for demodulating the modulated signal to decode the signal into the message ($u_1, u_2, \ldots, u_K$) having the information length K.

The LDPC encoder 11 of the transmitter 1 carries out a process of generating a codeword ($v_1, v_2, \ldots, v_N$) from the message ($u_1, u_2, \ldots, u_K$) having the information length K.

The modulator 12 of the transmitter 1 carries out a process of modulating the codeword ($v_1, v_2, \ldots, v_N$) generated by the LDPC encoder 11, and then transmitting the modulated signal ($x_1, x_2, \ldots, x_N$) to the receiver 2 via the channel 3. The modulator 12 configures a modulation means.

When receiving the modulated signal ($x_1, x_2, \ldots, x_N$) transmitted from the transmitter 1 as a modulated signal ($y_1, y_2, \ldots, y_N$) the demodulator 21 of the receiver 2 performs digital demodulation on the modulated signal ($y_1, y_2, \ldots, y_N$) and outputs a codeword ($v_1, v_2, \ldots, v_N$) which is the demodulated result. The demodulator 21 configures a demodulating means.

The LDPC decoder 22 of the receiver 2 carries out a process of decoding the codeword ($v_1, v_2, \ldots, v_N$) outputted from the demodulator 21 into the message ($u_1, u_2, \ldots, u_K$) having the information length K.

Figure 2:
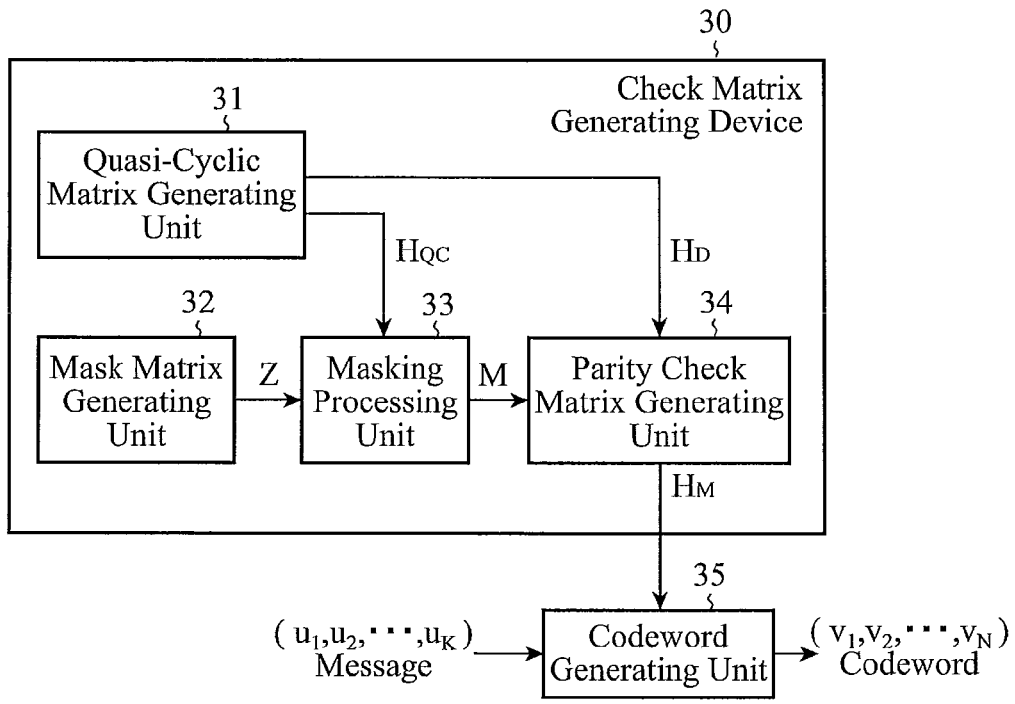
FIG. 2 is a block diagram showing an LDPC encoder 11 in accordance with Embodiment 1 of the present invention.

FIG. 2 is a block diagram showing the LDPC encoder 11 in accordance with Embodiment 1 of the present invention. In the figure, a check matrix generating device 30 generates a parity check matrix $H_M$.

A quasi-cyclic matrix generating unit 31 of the check matrix generating device 30 carries out a process of arranging J cyclic permutation matrices $I(p_{j,l})$ with p rows and p columns ($0 \leq j \leq J-1$ and $0 \leq l \leq L-1$) in each row direction and also arranging L cyclic permutation matrices $I(p_{j,l})$ in each column direction so as to generate a regular quasi-cyclic matrix $H_{QC}$ with uniform row and column weights.

In this case, when generating the regular quasi-cyclic matrix $H_{QC}$, the quasi-cyclic matrix generating unit 31 configures the regular quasi-cyclic matrix by combining cyclic permutation matrices $I(p_{j,l})$ in each of which matrix elements whose row number is r ($0 \leq r \leq p-1$) and whose column number is $(r+p_{j,l})$ mod p are "1"s, and the other matrix elements are "0"s in such a way that a plurality of cyclic permutation matrices $I(p_{j,l})$ arranged in a specific row (e.g. the 1st row) differ from one another. The quasi-cyclic matrix generating unit 31 configures a quasi-cyclic matrix generating means.

A mask matrix generating unit 32 of the check matrix generating device 30 carries out a process of generating a mask matrix Z which can adapt to a plurality of coding rates. The mask matrix generating unit 32 configures a mask matrix generating means.

A masking processing unit 33 of the check matrix generating device 30 carries out a process of converting a specific cyclic permutation matrix $I(p_{j,l})$ within the regular quasi-cyclic matrix $H_{QC}$ generated by the quasi-cyclic matrix generating unit 31 into a zero matrix by using the mask matrix Z generated by the mask matrix generating unit 32 so as to generate an irregular masked quasi-cyclic matrix M. The masking processing unit 33 configures a masking means.

A parity check matrix generating unit 34 of the check matrix generating device 30 carries out a process of placing the masked quasi-cyclic matrix M generated by the masking processing unit 33 and a matrix in which the cyclic permutation matrices $I(p_{j,l})$ are arranged in a stair-step shape at predetermined positions respectively so as to generate an irregular parity check matrix $H_M$ for LDPC code. The parity check matrix generating unit 34 configures a parity check matrix generating means.

A codeword generating unit 35 carries out a process of generating a codeword $(v_1, v_2, \ldots, v_N)$ from the message $(u_1, u_2, \ldots, u_K)$ having the information length K by using the parity check matrix $H_M$ generated by the parity check matrix generating unit 34. The codeword generating unit 35 configures a codeword generating means.

Figure 3:
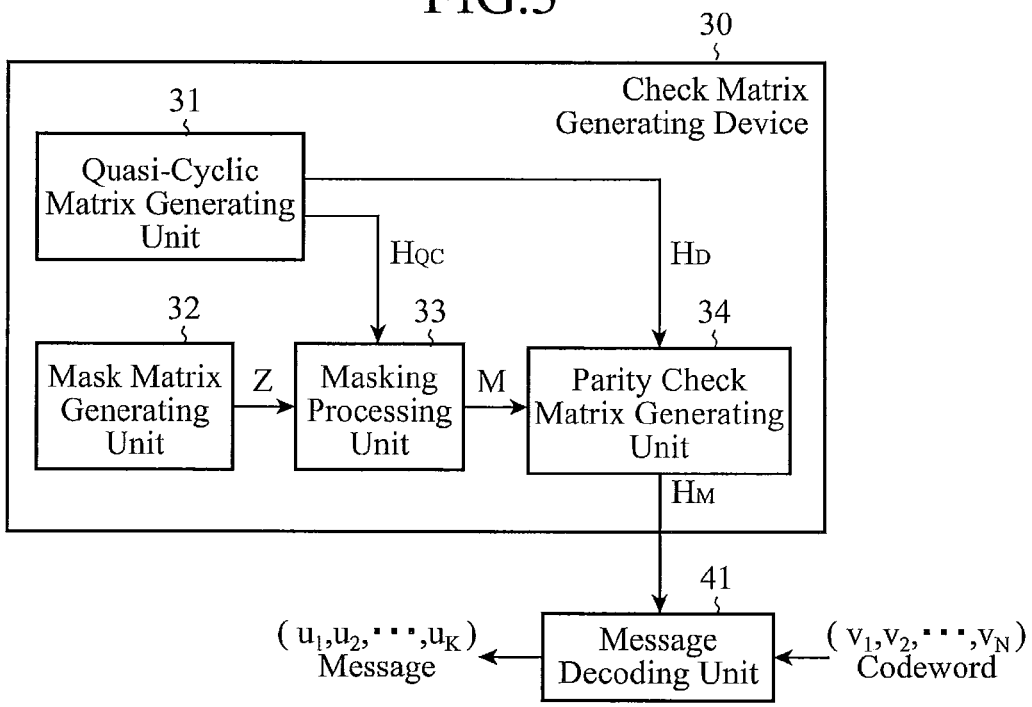
FIG. 3 is a block diagram showing the LDPC decoder 22 in accordance with Embodiment 1 of the present invention.

FIG. 3 is a block diagram showing the LDPC decoder 22 in accordance with Embodiment 1 of the present invention. In the figure, because the same reference numerals as those shown in FIG. 2 denote the same components or like components, the explanation about the components will be omitted hereafter.

A message decoding unit 41 carries out a process of decoding the codeword $(v_1, v_2, \ldots, v_N)$ outputted from the demodulator 21 into the message $(u_1, u_2, \ldots, u_K)$ having the information length K by using the parity check matrix $H_M$ generated by the parity check matrix generating unit 34. The message decoding unit 41 configures a decoding means.

Figure 4:
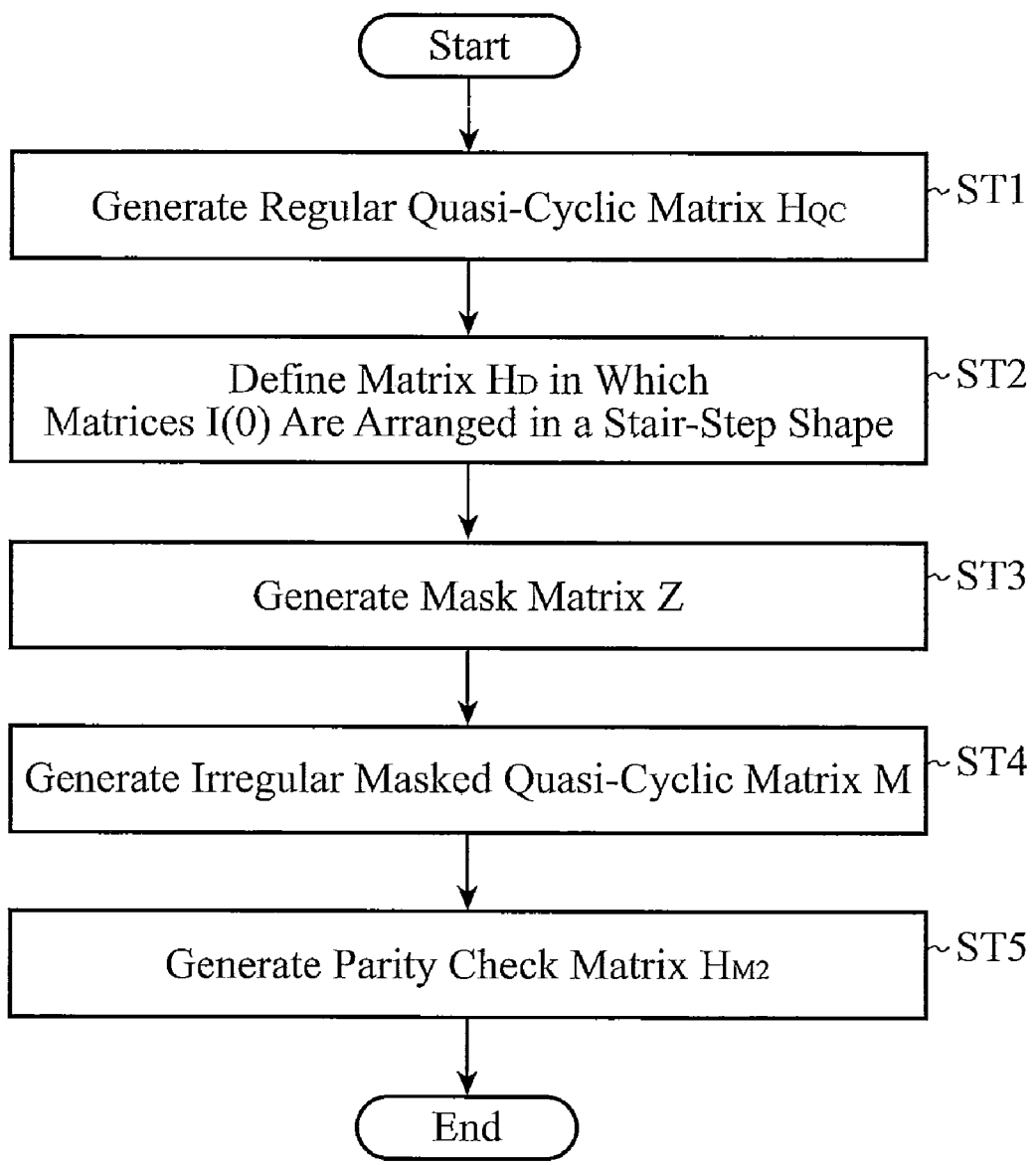
FIG. 4 is a flow chart showing a check matrix generating method in accordance with Embodiment 1 of the present invention.

FIG. 4 is a flow chart showing a check matrix generating method in accordance with Embodiment 1 of the present invention.

Next, the operations of the transmitter and the receiver will be explained.

The check matrix generating device 30 of the LDPC encoder 11 in the transmitter 1 generates a parity check matrix $H_M$ with M rows and N columns.

Similarly, the check matrix generating device 30 of the LDPC decoder 22 in the receiver 2 also generates a parity check matrix $H_M$ with M rows and N columns.

A generating method of generating the parity check matrix $H_M$ in each of the check matrix generating devices 30 will be mentioned below.

When receiving a message $u=(u_1, u_2, \ldots, u_K)$ having an information length K, the codeword generating unit 35 of the LDPC encoder 11 generates a codeword $v=(v_1, v_2, \ldots, v_N)$ having a length N by using the parity check matrix $H_M$ generated by the check matrix generating device 30, as shown in the following equation (3).

The codeword generating unit 35 carries out a process of encoding information bits without using a generator matrix G (K: information length, N: code word length) which is generated previously, unlike in a case of a conventional example.

$$v = \{(v_1, v_2, \ldots, v_N) \in GF\,(2) | (v_1, v_2, \ldots, v_N) H_M^T = 0\} \quad (3)$$

When the LDPC encoder 11 generates the codeword $v=(v_1, v_2, \ldots, v_N)$, the modulator 12 of the transmitter 1 carries out digital modulation of the codeword v by using a predetermined modulation method (e.g. BPSK, QPSK, or multiple value QAM), and transmits the modulated signal $x=(x_1, x_2, \ldots, x_N)$ to the receiver 2 via the channel 3.

It is assumed that in an error occurs in the modulated signal $x=(x_1, x_2, \ldots, x_N)$ transmitted from the transmitter 1 during transmission through the channel 3, and the signal including the error is received by the receiver 2.

When receiving the modulated signal $y=(y_1, y_2, \ldots, y_N)$ including the error, the demodulator 21 of the receiver 2 performs digital demodulation according to the modulation method, such as BPSK, QPSK, or multiple value QAM, on the modulated signal $y=(y_1, y_2, \ldots, y_N)$.

When receiving the demodulated result of the demodulator 21, the LDPC decoder 22 of the receiver 2 performs iterative decoding according to the "sum-product algorithm" on the demodulated result so as to decode the demodulated result to generate the message $(u_1, u_2, \ldots, U_K)$ having the information length K, and then outputs the message $(u_1, u_2, \ldots, u_K)$.

More specifically, the message decoding unit 41 of the LDPC decoder 22 decodes the codeword $(v_1, v_2, \ldots, v_N)$ outputted from the demodulator 21 into the message $(u_1, u_2, \ldots, u_K)$ having the information length K by using the parity check matrix $H_M$ generated by the check matrix generating device 30.

Hereafter, a generating method of generating the parity check matrix $H_M$ by the check matrix generating device 30 will be explained.

This Embodiment 1 is based on that an irregular (the weight distribution is ununiform) parity check matrix is generated, and an LDGM (Low Density Generation Matrix) structure is adopted as the structure of the irregular parity check matrix.

In FIGS. 2 and 3, the example in which the check matrix generating device 30 is built in each of the LDPC encoder 11 and the LDPC decoder 22 is shown, though the check matrix generating device 30 can be alternatively disposed outside the LDPC encoder 11 and the LDPC decoder 22 and the LDPC encoder 11 and the LDPC decoder 22 can store the parity check matrix $H_M$ generated by the check matrix generating device 30.

The quasi-cyclic matrix generating unit 31 arranges J cyclic permutation matrices $I(p_{j,l})$ with p rows and p columns in each row direction and also arranges L cyclic permutation matrices $I(p_{j,l})$ with p rows and p columns in each column direction so as to generate a regular quasi-cyclic matrix $H_{QC}$ as shown in the above-mentioned equation (2) (step ST1). In this case, the following relationships hold: $0 \leq j \leq J-1$ and $0 \leq l \leq L-1$.

In this case, when generating the regular quasi-cyclic matrix $H_{QC}$, the quasi-cyclic matrix generating unit 31 configures the regular quasi-cyclic matrix by combining cyclic permutation matrices $I(p_{j,l})$ in each of which matrix elements whose row number is r ($0 \leq r \leq p-1$) and whose column number is $(r+p_{j,l})$ mod p are "1"s, and the other matrix elements are "0"s. For example, the quasi-cyclic matrix generating unit 31 configures the regular quasi-cyclic matrix in such a way that a plurality of cyclic permutation matrices $I(p_{j,l})$ arranged in the 1st row differ from one another (the details of this process will be mentioned below).

The quasi-cyclic matrix generating unit 31 also defines a matrix $H_D$ with M (=pJ) rows and M (=pJ) columns which is a matrix in which matrices I(0) are arranged in a stair-step shape as follows (step ST2).

$$H_D = \begin{bmatrix} I(0) & 0 & \cdots & \cdots & 0 \\ I(0) & I(0) & 0 & & \vdots \\ 0 & \ddots & \ddots & \ddots & \vdots \\ \vdots & \ddots & I(0) & I(0) & 0 \\ 0 & \cdots & 0 & I(0) & I(0) \end{bmatrix}. \qquad \text{[Equation 2]}$$

where I(0) is a unit matrix and 0 is a zero matrix.

The mask matrix generating unit 32 generates a J×L matrix having two elements as a mask matrix $Z=[z_{j,l}]$ which can adapt to a plurality of coding rates (step ST3).

After the quasi-cyclic matrix generating unit 31 generates the regular quasi-cyclic matrix $H_{QC}$ and the mask matrix generating unit 32 generates the mask matrix Z, the masking processing unit 33 carries out a masking arithmetic operation as will be shown below so as to convert a specific cyclic permutation matrix $I(p_{j,l})$ within the regular quasi-cyclic matrix $H_{QC}$ into a zero matrix, and to generate an irregular masked quasi-cyclic matrix M (step ST4).

$$M = Z \otimes H_{QC} \qquad \text{[Equation 3]}$$
$$= \begin{bmatrix} z_{0,0} I(p_{0,0}) & \cdots & z_{0,L-1} I(p_{0,L-1}) \\ \vdots & \ddots & \vdots \\ z_{J-1,0} I(p_{J-1,0}) & \cdots & z_{J-1,L-1} I(p_{J-1,L-1}) \end{bmatrix}$$

$$z_{j,l} I(p_{j,l}) = \begin{cases} I(p_{j,l}) & \text{for } z_{j,l} = 1, \\ 0 & \text{for } z_{j,l} = 0. \end{cases}$$

After the masking processing unit 33 generates the masked quasi-cyclic matrix M, the parity check matrix generating unit 34 generates a parity check matrix $H_{M1}$ which is not masked from both the regular quasi-cyclic matrix $H_{QC}$ and the matrix $H_D$ which are generated by the quasi-cyclic matrix generating unit 31, and also generates a masked parity check matrix $H_{M2}$ from both the masked quasi-cyclic matrix M and the matrix $H_D$ (step ST5).

$$H_{M1} := [H_{QC} | H_D],\ H_{M2} := [M | H_D]. \qquad \text{[Equation 4]}$$

As a result, the parity check matrices $H_{M1}$ and $H_{M2}$ are generated. In order to provide a code having a low coding rate, an extension of the parity check matrices $H_{M1}$ and $H_{M2}$ will be considered hereafter.

First, an M×M matrix Hl is defined with codes defined by the parity check matrices $H_{M1}$ and $H_{M2}$ being expressed respectively as $C_{M1}$ and $C_{M2}$.

$$H_I := \begin{bmatrix} I(0) & 0 & \cdots & \cdots & 0 \\ 0 & I(0) & \ddots & & \vdots \\ \vdots & \ddots & I(0) & \ddots & \vdots \\ \vdots & & \ddots & I(0) & 0 \\ 0 & \cdots & \cdots & 0 & I(0) \end{bmatrix} \qquad \text{[Equation 5]}$$

Furthermore, for nonnegative integers i and t, and an M×(N−M) matrix Ai which will be defined below, a J×L mask matrix $Z_A$ is defined.

$$Z_{A_i} = \begin{bmatrix} z_{(Ji),0} & z_{(Ji),1} & \cdots & z_{(Ji),L-1} \\ z_{(Ji+1),0} & z_{(Ji+1),1} & \cdots & z_{(Ji+1),L-1} \\ \vdots & \vdots & \ddots & \vdots \\ z_{(Ji+J-1),0} & z_{(Ji+J-1),1} & \cdots & z_{(Ji+J-1),L-1} \end{bmatrix} \qquad \text{[Equation 6]}$$

In addition, an M×N matrix $H_A$ is defined.

$$H_{A_i} = \begin{bmatrix} I(p_{(Ji),0}) & \cdots & I(p_{(Ji),L-1}) \\ \vdots & \ddots & \vdots \\ I(p_{(Ji+J-1),0}) & \cdots & I(p_{(Ji+J-1),L-1}) \end{bmatrix}. \qquad \text{[Equation 7]}$$

In addition, by defining (tM)×(N+(t−1)M) matrices $H_{E1}$ and $H_{E2}$ for the nonnegative integer t as follows, the parity check matrices $H_{E1}$ and $H_{E2}$ are generated.

$$H_{E1} := \begin{bmatrix} H_{QC} & H_D & 0 & \cdots & \cdots & 0 \\ H_{A_1} & H_I & H_I & \ddots & \ddots & \vdots \\ H_{A_2} & 0 & \ddots & \ddots & \ddots & \vdots \\ \vdots & \vdots & \ddots & \ddots & \ddots & 0 \\ H_{A_{i-1}} & 0 & \cdots & 0 & H_I & H_I \end{bmatrix}, \qquad \text{[Equation 8]}$$

$$H_{E2} := \begin{bmatrix} M & H_D & 0 & \cdots & \cdots & 0 \\ A_1 & H_I & H_I & \ddots & \ddots & \vdots \\ A_2 & 0 & \ddots & \ddots & \ddots & \vdots \\ \vdots & \vdots & \ddots & \ddots & \ddots & 0 \\ A_{i-1} & 0 & \cdots & 0 & H_I & H_I \end{bmatrix},$$

$$A_i = Z_{A_i} \otimes H_{A_i}.$$

LDPC codes defined by the matrices $H_{E1}$ and $H_{E2}$ are expressed as $C_{E1}$ and $C_{E2}$ respectively.

Up to now, it is assumed that the cyclic permutation matrix used for the stair-step structure is I(0), though it is not necessary to limit the cyclic permutation matrix to I(0) and a combination of arbitrary matrices $I(s|s \in [0, p-1])$ can be provided.

The LDGM structure is the one in which a part of a parity check matrix is a lower triangular matrix, such as the structure of the matrices $H_{E1}$ and $H_{E2}$. By using this LDGM structure, the encoding can be implemented easily without having to use any generator matrix G.

For example, when a systematic codeword v is as shown in the following equation and an information message $u = (u_1, u_2, \ldots, u_K)$ is provided, because a parity element $p_m = (p_1, p_2, \ldots, p_M)$ satisfies "$H \cdot v^T = 0$", the parity element pm is generated as shown in the following equation (4).

$$v = (v_1, v_2, \ldots, v_K, v_{K+1}, v_{K+2}, \ldots, v_N)$$
$$= (u_1, u_2, \ldots, u_K, p_1, p_2, \ldots, p_M)$$

where N=K+M.

[Equation 9]

$$P_m = \sum_{n=1}^{K+m-1} v_n h_{m,n}, \ 1 \le m \le M, \ 1 \le n \le N \quad (4)$$

where $h_{m,n}$ denotes an element whose row number is m and whose column number is n in the parity check matrix H.

Hereafter, a condition under which the girth g is six or more (g≧6) will be examined.

More specifically, theorem 1, theorem 2, theorem 3, and corollary 4 which establish the following relationship g≧6 will be explained.

Theorem 1 (Refer to the Following Reference 1)

In the Tanner graph expression of a quasi-cyclic matrix $H_{QC}$, the necessary and sufficient conditions which make the quasi-cyclic matrix satisfy g≧6 is that the following equation (5) is established.

[Equation 10]

$$p_{j_0,l_0} - p_{j_1,l_0} + p_{j_1,l_1} - p_{j_0,l_1} \not\equiv 0 \ (\mathrm{mod} \ p)$$

For $j_0 \ne j_1$, $l_0 \ne l_1$. \hfill (5)

REFERENCE 1

M. Fossorier, "Quaff-Cyclic Low-Density Parity-Check Codes From Circulant Permutation Matrices", IEEE Trans. Inform. Theory, Vol. 50, No. 8 (2004) pp. 1788-1793.

Theorem 2

In a case of J<L, when L is a prime number, there exists a (J,L)-regular QC LDPC code having a girth satisfying and based on $H_{QChat}$ at p=L.

In this case, $H_{QChat}$ is a matrix $H_{QC}$ having the following regularity.

$$p_{j,l} = j \cdot p_{1,l} \ (\mathrm{mod} \ p), \ 0 \le p_{1,l_i} \le p-1, \ p_{1,l_0} \ne p_{1,l_1}, \ l_0 \ne l_1. \quad \text{[Equation 11]}$$

Furthermore, a regular LDPC with column weight J and row weight L is referred to as a (J,L)-regular LDPC code, and an LDPC code using a quasi-cyclic check matrix is referred to as a (J,L)-regular QC LDPC code.

Hereafter, it will be proved that the theorem 2 is correct.

Verification of the existence of a (J,L)-regular QC LDPC code based on $H_{QChat}$ at p=L and having a girth satisfying g≧6 means that the theorem 2 is proved to be correct.

More specifically, when the existence of a (J,L)-regular QC LDPC code having a girth satisfying g≧6 can be verified within the limits defined by the following equation (6), the theorem 2 is proved to be correct.

[Equation 12]

$$p_{j,l} = j \cdot p_{1,l_1} \ (\mathrm{mod} \ L), \ 0 \le p_{1,l_1} < L, \ 0 \le j < J \quad (6)$$

When the following equation (7) can be verified from the theorem 1, the existence of a (J,L)-regular QC LDPC code based on $H_{QChat}$ at p=L and having a girth satisfying g≧6 is verified.

[Equation 13]

$$\begin{aligned} p_{j_0,l_0} - p_{j_1,l_0} + p_{j_1,l_1} - p_{j_0,l_1} &= j_0 \cdot p_{1,l_0} - j_1 \cdot p_{1,l_0} + j_1 \cdot p_{1,l_1} - j_0 \cdot p_{1,l_1} \\ &= (j_0 - j_1)(p_{1,l_0} - p_{1,l_1}) \not\equiv 0 \ (\mathrm{mod} \ L) \end{aligned} \quad (7)$$

For example, assuming the following equation (8), in a case of $j_0 > j_1$, the following relationship holds: $1 \le j_0 - j_1 < J$.

[Equation 14]

$$(j_0 - j_1)(p_{1,l_0} - p_{1,l_1}) \equiv 0 \ (\mathrm{mod} \ L) \quad (8)$$

Because L is a prime number, the following equation (9) holds and there exist integers a and b which satisfy the following equation (10).

[Equation 15]

$$\gcd(j_0 - j_1, L) = 1 \quad (9)$$

where gcd is a mathematical symbol for calculating the least common multiple.

$$a(j_0 - j_1) + bL = 1 \quad (10)$$

Therefore, the following equation holds: $a(j_0-j_1) \equiv 1$ (mod L), and there exists an inverse element $(j_0-j_1)^{-1}$ (mod L).

Therefore, the following equation (11) is established.

[Equation 16]

$$p_{1,l_0} - p_{1,l_1} = (j_0-j_1)^{-1}(j_0-j_1)(p_{1,l_0} - p_{1,l_1}) \equiv 0 \ (\mathrm{mod} \ L) \quad (11)$$

Because this is contradictory to the following equation (12), the equation (7) is established.

[Equation 17]

$$p_{1,l_0} \ne p_{1,l_1} \quad (12)$$

Furthermore, also in a case of $j_0 < j_1$, the following relationship holds: $1 \le j_0 - j_1 < J$.

Also in the case of $j_0 < j_1$, when verification is performed in the same way as that in the case of $j_0 > j_1$, the equation (7) is established.

Therefore, it is verified from the theorem 1 that there exists $H_{QChat}$ which satisfies g≧6 and p=L, and this means that the theorem 2 is proved to be correct.

Next, conditions imposed on $H_{QChat}$ to guarantee that $H_{QChat}$ has a girth satisfying g≧6 will be specified.

Theorem 3

$H_{QChat}$ in which p is a prime number and the following relationships hold: and has a girth satisfying g≧6.

Hereafter, it will be proved that the theorem 3 is correct.

When it is verified that $H_{QChat}$ satisfying J≧L and g≧6 always satisfies the equation (14), the theorem 3 is proved to be correct.

More specifically, when it is verified that $H_{QChat}$ having a girth satisfying g≧6 always satisfies the equation (14) within the limits defined by the following equation (13), the theorem 3 is proved to be correct.

[Equation 18]

$$p_{j,l} = j \cdot p_{1,l_1} \ (\mathrm{mod} \ p), \ 0 \le p_{1,l_1} < L \le p, \ 0 \le j < J < p \quad (13)$$

-continued $$p_{j_0,l_0} - p_{j_1,l_0} + p_{j_1,l_1} - p_{j_0,l_1} = j_0 \cdot p_{1,l_0} - j_1 \cdot p_{1,l_0} + j_1 \cdot p_{1,l_1} - j_0 \cdot p_{1,l_1} \quad (14)$$
$$= (j_0 - j_1)(p_{1,l_0} - p_{1,l_1}) \neq 0 \pmod{p}$$

Under the conditions defined by the following equation (15), the following inequality (16) is established.
[Equation 19]

$$j_0 > j_1, p_{1,l_0} > p_{1,l_1} \quad (15)$$

$$1 \leq j_0 - j_1 < J \leq p, \, 1 \leq p_{1,J_0} - p_{1,J_1} < L \leq p \quad (16)$$

At this time, because p is a prime number, the following equations (17) and (18) are established and the following equation (19) is drawn directly from these equations (refer to pp. 8 and 9 of the following reference 2).
[Equation 20]

$$\gcd((j_0 - j_1), p) = 1 \quad (17)$$

$$\gcd((p_{1,l_0} - p_{1,l_1}), p) = 1 \quad (18)$$

$$\gcd((j_0 - j_1)(p_{1,l_0} - p_{1,l_1}), p) = 1 \quad (19)$$

Therefore, the equation (14) is established.

Similarly, under the conditions defined by the following equation (20), the following inequality (21) is established.
[Equation 21]

$$j_0 < j_1, p_{1,l_0} > p_{1,l_1} \quad (20)$$

$$1 \leq -(j_0 - j_1) < J < p, \, 1 \leq p_{1,l_0} - p_{1,l_1} < L \leq p \quad (21)$$

At this time, because p is a prime number, the following equations (22) and (23) are established and the following equation (24) is drawn directly from these equations (refer to pp. 8 and 9 of the following reference 2).
[Equation 22]

$$\gcd(-(j_0 - j_1), p) = 1 \quad (22)$$

$$\gcd((p_{1,l_0} - p_{1,l_1}), p) = 1 \quad (23)$$

$$\gcd(-(j_0 - j_1)(p_{1,l_0} - p_{1,l_1}), p) = 1 \quad (24)$$

Therefore, the following equation (25) is established.
[Equation 23]

$$-(j_0 - j_1)(p_{1,l_0} - p_{1,l_1}) \neq 0 \pmod{p} \quad (25)$$

Therefore, the equation (14) is established.

When even under the conditions defined by the following equation (26), and under the conditions defined by the equation (27), verification is carried out according to the same procedure as that according to which verification is carried out under the conditions defined by the following equation (15), and under the conditions defined by the equation (20), it is proved that the equation (14) is established.

Therefore, it is verified that the theorem 3 is correct.
[Equation 24]

$$j_0 > j_1, p_{1,l_0} < p_{1,l_1} \quad (26)$$

$$j_0 < j_1, p_{1,l_0} < p_{1,l_1} \quad (27)$$

REFERENCE 2

"Exercises for Introduction to Group, Ring and Field" written by Hiroshi Niitsuma and Tetsuzo Kimura, and published by KYORITSU SHUPPAN Co., Ltd.

Corollary 4 (Theorem)

When p is a prime number, and the following relationships hold: $J \geq L$ and $p \geq J$, if $H_{QChat}$ includes $p_{1,\hat{l}} = 0$, a QC LDPC code which is defined by the matrix $H_{E1}$ consisting of both a matrix $H'_{QChat}$ from which a column of $p_{1,\hat{l}} = 0$ is removed, and the matrix $H_D$ has a girth satisfying $g \geq 6$.

Hereafter, it will be proved that the corollary 4 is correct.

Because it is clear from the theorem 3 that $H_{QChat}$ including $p_{1,\hat{l}} = 0$ also has a girth satisfying $g \geq 6$, the corollary 4 is proved to be correct when the theorem 1 is satisfied between the matrix $H'_{QChat}$ and the matrix $H_D$.

The relationship associated with the loop 4 between the matrix $H'_{QChat}$ and the matrix $H_D$ verifies the equation (5) in a matrix given by the following equation (28).

[Equation 25]

$$\text{for } 0 \leq j \leq J-2, \text{ and } 0 \leq l \leq L-1 \quad (28)$$
$$\begin{bmatrix} I(p_{j,l}) & I(0) \\ I(p_{j+1,l}) & I(0) \end{bmatrix}.$$

Because $H_{QChat}$ including $p_{1,\hat{l}} = 0$ also has a girth satisfying $g \geq 6$, the following equation (29) is established for the matrix of the equation (28).
[Equation 26]

$$p_{j,l} - p_{j+1,l} + 0 - 0 \neq 0 \pmod{p} \quad (29)$$

Therefore, it is verified that the corollary 4 is correct.

Because the column of $p_{1,\hat{l}} = 0$ is removed from the matrix $H'_{QChat}$, the condition under which the $H_{QChat}$ has a girth satisfying $g \geq 6$ are $p \geq L+1$.

Next, a design method for will be explained.

It is clear from the above-mentioned theorem 3 that by designing the matrix $H_{QC}$ in such a way that this matrix satisfies the following conditions (i) and (ii), an LDPC code having a girth satisfying can be configured.
[Equation 27]

$$p_{j,l} = j \cdot p_{1,l_i} \pmod{p}, \, 0 \leq p_{1,l_i} \leq p-1, \, p_{1,l_0} \neq p_{1,l_1}, \, l_0 \neq l_1. \quad (i)$$

p is a prime number, and $J \geq L$, and $p \geq J$.

Furthermore, in order to provide an LDPC code having an LDGM structure, it is clear from the theorem 3 and the corollary 4 that by designing the matrix $H_{E1}$ in such a way that this matrix consists of both the matrix $H_{QC}$ which satisfies the following conditions (iii) and (iv), and the matrix $H_D$, an LDPC code having an LDGM structure satisfying $g \geq 6$ can be configured.
[Equation 28]

$$p_{j,l} = j \cdot p_{1,l_i} \pmod{p}, \, 0 < p_{1,l_i} \leq p-1, \, p_{1,l_0} \neq p_{1,l_1}, \, l_0 \neq l_1. \quad (iii)$$

p is a prime number, and $J \geq L+1$ and $p \geq J$. (ii)

In the corollary 4, because the column of $p_{1,\hat{l}} = 0$ is removed from the matrix $H'_{QChat}$, the condition under which the $H_{QChat}$ has a girth satisfying $g \geq 6$ are $p \geq L+1$, as shown in the condition (iv).

By using the matrix $H_{E1}$ as a base and then generating the matrix $H_{E2}$ on which masking is performed according to an appropriate degree distribution, an irregular-QC LDPC code having a girth satisfying $g \geq 6$ can also be configured.

Hereafter, a concrete numerical example will be specified.

It is clear from the theorem 2 that the following matrix $H_{QC}$ has a girth satisfying $g \geq 6$ at $p = 3$.

[Equation 29]

$$H_{QC} = \begin{bmatrix} I(0) & I(0) & I(0) \\ I(0) & I(1) & I(2) \\ I(0) & I(2) & I(1) \end{bmatrix}$$

The parity check matrix $H_{M1}$ can be generated from this matrix $H_{QC}$.

[Equation 30]

$$H_{M1} = \begin{bmatrix} I(0) & I(0) & I(0) & 0 & 0 \\ I(1) & I(2) & I(0) & I(0) & 0 \\ I(2) & I(1) & 0 & I(0) & I(0) \end{bmatrix}$$

By masking this parity check matrix $H_{M1}$, the parity check matrix $H_{M2}$ can be generated.

[Equation 31]

$$H_{M2} = \begin{bmatrix} I(0) & I(0) & I(0) & 0 & 0 \\ I(1) & 0 & I(0) & I(0) & 0 \\ I(2) & I(1) & 0 & I(0) & I(0) \end{bmatrix}$$

It is guaranteed that all of these matrices $H_{QC}$, $H_{M1}$, and $H_{M2}$ have a girth satisfying $g \geq 6$.

Furthermore, a matrix $H_{QC}$ and a matrix $H_A$ having a structure including $p_{1,j}=0$ and having a girth satisfying $g \geq 8$ are prepared according to the same procedure, and an LDPC code having an LDGM structure satisfying $g \geq 6$ can be configured when a column of $p_{1,j}=0$ is removed from each of these matrix $H_{QC}$ and matrix $H_A$ and the matrix $H_{E1}$ is designed by using the matrix $H_D$ and the matrix $H_I$.

By using the matrix $H_{E1}$ as a base and then generating the matrix $H_{E2}$ on which masking is performed according to an appropriate degree distribution, an irregular-QC LDPC code having a girth satisfying $g \geq 6$ can also be configured.

Hereafter, a concrete numerical example will be specified.

It is clear from the theorem 2 that the following matrix $H_{QC}$ has a girth satisfying $g \geq 6$ at $p=7$.

[Equation 32]

$$\begin{bmatrix} H_{QC} \\ H_{A_1} \end{bmatrix} = \begin{bmatrix} I(0) & I(0) & I(0) \\ I(0) & I(1) & I(2) \\ I(0) & I(2) & I(4) \\ I(0) & I(3) & I(6) \\ I(0) & I(4) & I(1) \\ I(0) & I(5) & I(3) \end{bmatrix}$$

The parity check matrix $H_{E1}$ can be generated from the above-mentioned matrix.

[Equation 33]

$$H_{E1} = \begin{bmatrix} I(0) & I(0) & I(0) & I(0) & 0 & 0 & 0 & 0 & 0 \\ I(1) & I(2) & 0 & I(0) & I(0) & 0 & 0 & 0 & 0 \\ I(2) & I(4) & 0 & 0 & I(0) & I(0) & 0 & 0 & 0 \\ I(3) & I(6) & I(0) & 0 & 0 & 0 & I(0) & 0 & 0 \\ I(4) & I(1) & 0 & I(0) & 0 & 0 & 0 & I(0) & 0 \\ I(5) & I(3) & 0 & 0 & I(0) & 0 & 0 & 0 & I(0) \end{bmatrix}$$

By masking this parity check matrix $H_{E1}$, the parity check matrix $H_{E2}$ can be generated.

[Equation 34]

$$H_{E2} = \begin{bmatrix} I(0) & I(0) & I(0) & I(0) & 0 & 0 & 0 & 0 & 0 \\ I(1) & 0 & 0 & I(0) & I(0) & 0 & 0 & 0 & 0 \\ I(2) & I(4) & 0 & 0 & I(0) & I(0) & 0 & 0 & 0 \\ 0 & I(6) & I(0) & 0 & 0 & 0 & I(0) & 0 & 0 \\ I(4) & 0 & 0 & I(0) & 0 & 0 & 0 & I(0) & 0 \\ I(5) & I(3) & 0 & 0 & I(0) & 0 & 0 & 0 & I(0) \end{bmatrix}$$

It is guaranteed that all of these matrices $H_{E1}$ and $H_{E2}$, and so on have a girth satisfying $g \geq 6$.

As can be seen from the above description, in accordance with this Embodiment 1, when generating a regular quasi-cyclic matrix $H_{QC}$, the quasi-cyclic matrix generating unit 31 configures the regular quasi-cyclic matrix by combining cyclic permutation matrices $I(p_{j,l})$ in each of which matrix elements whose row number is r ($0 \leq r \leq p-1$) and whose column number is $(r+p_{j,l})$ mod p are "1"s, and the other matrix elements are "0"s in such a way that a plurality of cyclic permutation matrices $I(p_{j,l})$ arranged in the 1st row differ from one another. Therefore, the present embodiment offers an advantage of being able to easily generate a parity check matrix $H_M$ having good performance and regularity, and so on.

Embodiment 2

In above-mentioned Embodiment 1, the example in which a parity check matrix $H_M$ having a girth satisfying $g \geq 6$, and so on are generated is shown. In contrast, in this Embodiment 2, generation of a parity check matrix $H_M$ having a girth satisfying $g=8$, and so on will be explained.

Hereafter, conditions under which such a matrix has a girth satisfying $g \geq 8$ will be considered.

More specifically, theorem 5, theorem 6 and corollary 7 which make such a matrix have a girth satisfying $g \geq 8$ will be explained.

Theorem 5 (Refer to the Above-Mentioned Reference 1)

In the Tanner graph expression of a quasi-cyclic matrix $H_{QC}$, the necessary and sufficient conditions which make the quasi-cyclic matrix satisfy $g \geq 8$ is that the equation (5) is established and the following equation (30) is established.

[Equation 35]

$$p_{j_0,l_0} - p_{j_1,l_0} + p_{j_1,l_1} - p_{j_2,l_1} + p_{j_2,l_2} - p_{j_0,l_2} \neq 0 \pmod{p} \text{ for } j_0 \neq j_1,$$
$$j_1 \neq j_2, l_0 \neq l_1, l_1 \neq l_2. \quad (30)$$

Theorem 6

In a case of $i=1, 2,$ or $\ldots$ , when all of $p_i J \times p_i L_i$ check matrices have a girth satisfying $g \geq 8$, there exists a $(p_1 p_2 \ldots) J \times (p_1 p_2 \ldots)(L_1 L_2 \ldots)$ check matrix have a girth satisfying $g \geq 8$.

Hereafter, it will be proved that the theorem 6 is correct.

First, a check matrix $H_{QC}^{(i)}$, where i=1 or 2, is defined as follows.

$$H_{QC}^{(i)}=(I(p_{j,l}^{(i)}))_{0 \leq j \leq J-1, 0 \leq l \leq L_i-1}$$

$$0 \leq p_{j,l}^{(i)} \leq L_i-1 \quad \text{[Equation 36]}$$

where $(I(p_{j,l}^{(i)}))_{0 \leq j \leq J-1, 0 \leq l \leq Li-1}$ is a quasi-cyclic matrix which is configured by combining cyclic permutation matrices $I(p_{j,l}^{(i)})$, where $0 \leq j \leq J-1$ and $0 \leq l \leq L_i-1$.

For example, in a case of $I(p_{j,l}^{(i)}))_{0 \leq j \leq 1, 0 \leq l \leq 2}$, the check matrix $H_{QC}^{(i)}$ is given as follows.

[Equation 37]

$$\begin{bmatrix} I(p_{0,0}^{(1)}) & I(p_{0,1}^{(1)}) & I(p_{0,2}^{(1)}) \\ I(p_{1,0}^{(1)}) & I(p_{1,1}^{(1)}) & I(p_{1,2}^{(1)}) \end{bmatrix}$$

Furthermore, the check matrix $H_{QC}^{(i)}$ has a girth satisfying $g \geq 8$, $p_i \geq Li$, and $p_i$ is a prime number.

Moreover, a new check matrix $H_{QC}^{(1,2)}$ is defined as follows.

$$H_{QC}^{(1,2)}=(I(p_{j,l}^{(1,2)}))_{0 \leq j \leq J-1, 0 \leq l \leq L_1L_2-1} \quad \text{[Equation 38]}$$

Furthermore, in a case of $0 \leq j \leq J-1$, $0 \leq q \leq L_1-1$, and $0 \leq r \leq L_2-1$, the following equation (31) is defined.

[Equation 39]

$$p_{j,qL_2+r}^{(1,2)}=p_{j,q}^{(1)}p_2+p_{j,r}^{(2)} \quad (31)$$

In this case, when the following equation is defined: $l_i=q_iL_2+r_i$, and it is verified that the following equations (32) and (33) are established from the conditional expressions for $g \geq 8$, the theorem 6 is proved to be correct.

[Equation 40]

$$d_1^a p_2 + d_2^a \neq 0 \pmod{p=p_1p_2} \quad (32)$$

$$d_1^b p_2 + d_2^b \neq 0 \pmod{p=p_1p_2} \quad (33)$$

First, the following equation is established.

$$d_1^a = p_{j_0,q_0}^{(1)} - p_{j_1,q_0}^{(1)} + p_{j_1,q_1}^{(1)} - p_{j_0,q_1}^{(1)}$$

$$d_2^a = p_{j_0,r_0}^{(2)} - p_{j_1,r_0}^{(2)} + p_{j_1,r_1}^{(2)} - p_{j_0,r_1}^{(2)}$$

$$d_1^b = p_{j_0,g_0}^{(1)} - p_{j_1,g_0}^{(1)} + p_{j_1,g_1}^{(1)} - p_{j_2,g_1}^{(1)} + p_{j_2,g_2}^{(1)} - p_{j_0,g_2}^{(1)}$$

$$d_2^b = p_{j_0,r_0}^{(2)} - p_{j_1,r_0}^{(2)} + p_{j_1,r_1}^{(2)} - p_{j_2,r_1}^{(2)} + p_{j_2,r_2}^{(2)} - p_{j_0,r_2}^{(2)} \quad \text{[Equation 41]}$$

At this time, because the following relationships hold: $j_0 \neq j_1$ and $l_0 \neq l_1$, a condition of $q_0 \neq q_1$ or $r_0 \neq r_1$ holds.

Assuming that the following relationships hold: $r_0 \neq r_1$ and $q_0 = q_1$, because the following relationships hold: $d_1^a = 0 \pmod{p_1}$ and $d_1^b = 0 \pmod{p_1}$, and the check matrix $H_{QC}^{(2)}$ satisfies the equations (5) and (30), the following relationships hold: $d_2^a \neq 0 \pmod{p_2}$ and $d_2^b \neq 0 \pmod{p_2}$.

Therefore, the above-mentioned equations (32) and (33) are established.

Furthermore, assuming that the following relationships hold: $r_0 = r_1$ and $q_0 \neq q_1$, because the following relationships hold: $d_2^a = 0 \pmod{p_2}$ and $d_2^b = 0 \pmod{p_2}$, and the check matrix $H_{QC}^{(1)}$ satisfies the equations (5) and (30), the following relationships hold: $d_1^a \neq 0 \pmod{p_1}$ and $d_1^b \neq 0 \pmod{p_1}$.

Therefore, the above-mentioned equations (32) and (33) are established.

In contrast, assuming that the following relationships hold: $r_0 \neq r_1$ and $q_0 \neq q_1$, because the check matrices $H_{QC}^{(1)}$ and $H_{QC}^{(2)}$ satisfy the equations (5) and (30), the following relationships hold: $d_2^a \neq 0 \pmod{p_2}$ and $d_2^b \neq 0 \pmod{p_2}$ and the following relationships hold: $d_1^a \neq 0 \pmod{p_1}$ and $d_1^b \neq 0 \pmod{p_1}$.

Therefore, the above-mentioned equations (32) and (33) are established.

Because it can be verified in the above-mentioned way that the equations (32) and (33) are established, the theorem 6 is proved to be correct.

Therefore, the necessary and sufficient conditions for $g \geq 8$ are satisfied.

By repeating this process recursively for the plural numbers i, a $(p_1p_2 \ldots) J \times (p_1p_2 \ldots)(L_1L_2 \ldots)$ check matrix having a girth satisfying $g \geq 8$ can be configured.

Corollary 7 (Theorem)

In a case of i=1, 2, or . . . , when all the $p_i J \times p_i L_i$ check matrices have a girth satisfying $g \geq 6$, there exists a $(p_1 p_2 \ldots) J \times (p_1p_2 \ldots)(L_1L_2 \ldots)$ check matrix having a girth satisfying $g \geq 6$.

Because the proof of the theorem 6 is verified by also using the conditional expression (5) for satisfying $g \geq 6$, the corollary 7 can be proved promptly to be correct.

Next, a design method for $g \geq 8$ will be explained.

It is clear from the above-mentioned theorem 6 that by designing a matrix $H_{QC}$ which satisfies the following conditions (i) and (vi), an LDPC code having a girth satisfying $g \geq 8$ can be configured.

The operation is ended at a time when the operation reaches a desired check matrix. Furthermore, the matrices $H_{QC}^{(i)}$ can be identical to one another because the theorem 6 is satisfied even in this case.

[Equation 42]

Prepare a $p_1 J \times p_1 L_1$ check matrix $H_{QC}^{(1)}=(I(p_{j,q}^{(1)}))$
$\quad 0 \leq j \leq J-1, 0 \leq q \leq L_1-1$ having a girth satisfying $g \geq 8$. (i)

Prepare a $p_2 J \times p_2 L_2$ check matrix $H_{QC}^{(2)}=(I(p_{j,q}^{(2)}))$
$\quad 0 \leq j \leq J-1, 0 \leq q \leq L_2-1$ having a girth satisfying $g \geq 8$. (ii)

Configure $H_{QC}^{(1,2)}=(I(p_{j,l=qL_2+r}^{(1,2)}=p_{j,q}^{(1)}p_2+p_{j,r}^{(2)}))$
$\quad 0 \leq j \leq J-1, 0 \leq l \leq L_1L_2-1$. (iii)

Prepare a $p_3 J \times p_3 L_3$ check matrix $H_{QC}^{(3)}=(I(p_{j,s}^{(3)}))$
$\quad 0 \leq j \leq J-1, 0 \leq s \leq L_3-1$ having a girth satisfying $g \geq 8$. (iv)

Configure $H_{QC}^{(1,2,3)}=(I(p_{j,k=lL_3+s}^{(1,2,3)}=p_{j,l}^{(1,2)}p_3+p_{j,s}^{(3)}))_{0 \leq j \leq J-1, 0 \leq k \leq L_1L_2L_3-1}$. (v)

Extend the check matrix according to the same procedure. (vi)

According to the above-mentioned procedure, by designing a parity check matrix $H_{M1}$ by using a matrix $H_D$ in which a row of $p_{1,i}=0$ is removed from the check matrix $H_{QC}$ including $p_{1,i}=0$ and having a girth satisfying $g \geq 8$, an LDPC code having an LDGM structure satisfying $g \geq 8$ can be configured.

By using the matrix $H_{M1}$ as a base and then generating a matrix $H_{M2}$ on which masking is performed according to an appropriate degree distribution, an irregular-QC LDPC code having a girth satisfying $g \geq 8$ can also be configured.

Hereafter, a concrete numerical example will be specified.

The following matrix $H_{QC}^{(1)}$ has been verified to have a girth satisfying $g \geq 8$ at $p_1=p_2=3$.

[Equation 43]

$$H_{QC}^{(1)} = H_{QC}^{(2)} = \begin{bmatrix} I(0) & I(0) \\ I(0) & I(1) \\ I(0) & I(2) \end{bmatrix}$$

Furthermore, $p = p_1 p_2 = 9$

-continued $$H_{QC} = H_{QC}^{(1,2)} = \begin{bmatrix} I(0) & I(0) & I(0) & I(0) \\ I(0) & I(1) & I(3) & I(4) \\ I(0) & I(2) & I(6) & I(8) \end{bmatrix}$$

The parity check matrix $H_{M1}$ can be generated from this matrix $H_{QC}$.

[Equation 44]

$$H_{M1} = \begin{bmatrix} I(0) & I(0) & I(0) & I(0) & 0 & 0 \\ I(1) & I(3) & I(4) & I(0) & I(0) & 0 \\ I(2) & I(6) & I(8) & 0 & I(0) & I(0) \end{bmatrix}$$

By masking this parity check matrix $H_{M1}$, the parity check matrix $H_{M2}$ can be generated.

[Equation 45]

$$H_{M2} = \begin{bmatrix} I(0) & I(0) & I(0) & I(0) & 0 & 0 \\ I(1) & I(3) & 0 & I(0) & I(0) & 0 \\ I(2) & 0 & I(8) & 0 & I(0) & I(0) \end{bmatrix}$$

It is guaranteed that all of these matrices $H_{QC}$, $H_{M1}$, and $H_{M2}$ have a girth satisfying $g \geq 8$.

Furthermore, a matrix $H_{QC}$ and a matrix $H_A$ each having a structure including a submatrix in which all the elements in a column are $p_{j,l}=0$, and having a girth satisfying $g \geq 8$ can be prepared according to the same procedure, and an LDPC code having an LDGM structure satisfying $g \geq 8$ can be configured when the submatrix in which all the elements in a column are $p_{j,l}=0$ is removed from each of these matrices $H_{QC}$ and $H_A$ and a matrix $H_{E1}$ is designed by using the matrix $H_D$ and a matrix $H_I$.

By using the matrix $H_{E1}$ as a base and then generating a matrix $H_{E2}$ on which masking is performed according to an appropriate degree distribution, an irregular-QC LDPC code having a girth satisfying $g \geq 8$ can also be configured.

Hereafter, a concrete numerical example will be specified.

The following matrix has been verified to have a girth satisfying $g \geq 8$ at $p_1 = p_2 = 3$.

$$\begin{bmatrix} H_{QC}^{(1)} \\ H_{A_1}^{(1)} \end{bmatrix} = \begin{bmatrix} H_{QC}^{(2)} \\ H_{A_1}^{(2)} \end{bmatrix} = \begin{bmatrix} I(0) & I(0) \\ I(0) & I(1) \\ I(0) & I(2) \\ I(0) & I(3) \\ I(0) & I(4) \\ I(0) & I(5) \end{bmatrix}$$ [Equation 46]

Furthermore, $p = p_1 p_2 = 49$ $$\begin{bmatrix} H_{QC} \\ H_{A_1} \end{bmatrix} = \begin{bmatrix} H_{QC}^{(1,2)} \\ H_{A_1}^{(1,2)} \end{bmatrix} = \begin{bmatrix} I(0) & I(0) & I(0) & I(0) \\ I(0) & I(1) & I(7) & I(8) \\ I(0) & I(2) & I(14) & I(16) \\ I(0) & I(3) & I(21) & I(24) \\ I(0) & I(4) & I(28) & I(32) \\ I(0) & I(5) & I(35) & I(40) \end{bmatrix}$$

The parity check matrix $H_{E1}$ can be generated from the above-mentioned matrix.

$$H_{E1} = \begin{bmatrix} I(0) & I(0) & I(0) & I(0) & 0 & 0 & 0 & 0 & 0 \\ I(1) & I(7) & I(8) & I(0) & I(0) & 0 & 0 & 0 & 0 \\ I(2) & I(14) & I(16) & 0 & I(0) & I(0) & 0 & 0 & 0 \\ I(3) & I(21) & I(24) & I(0) & 0 & 0 & I(0) & 0 & 0 \\ I(4) & I(28) & I(32) & 0 & I(0) & 0 & 0 & I(0) & 0 \\ I(5) & I(35) & I(40) & 0 & 0 & I(0) & 0 & 0 & I(0) \end{bmatrix}$$ [Equation 47]

By masking this parity check matrix $H_{E1}$, the parity check matrix $H_{E2}$ can be generated.

$$H_{E2} = \begin{bmatrix} I(0) & I(0) & I(0) & I(0) & 0 & 0 & 0 & 0 & 0 \\ I(1) & 0 & I(8) & I(0) & I(0) & 0 & 0 & 0 & 0 \\ I(2) & I(14) & 0 & 0 & I(0) & I(0) & 0 & 0 & 0 \\ 0 & I(21) & I(24) & I(0) & 0 & 0 & I(0) & 0 & 0 \\ I(4) & 0 & I(32) & 0 & I(0) & 0 & 0 & I(0) & 0 \\ I(5) & I(35) & 0 & 0 & 0 & I(0) & 0 & 0 & I(0) \end{bmatrix}$$ [Equation 48]

It is guaranteed that all of these matrices $H_{E1}$ and $H_{E2}$, and so on have a girth satisfying $g \geq 6$.

It is clear from the corollary 7 that according the same procedure, the matrices $H_{QC}$, $H_{M1}$, $H_{M2}$, $H_{E1}$, $H_{E2}$, and so on which are guaranteed to have a girth satisfying $g \geq 6$ can also be designed.

Embodiment 3

In above-mentioned Embodiment 2, the example in which a parity check matrix $H_M$ having a girth satisfying $g \geq 8$, and so on are generated is shown. In contrast, in this Embodiment 3, generation of a parity check matrix $H_M$ having a girth satisfying $g \geq 10$, and so on will be explained.

Hereafter, conditions under which such a matrix has a girth satisfying $g \geq 10$ will be examined.

More specifically, theorem 8 and theorem 9 which make such a matrix have a girth satisfying $g \geq 10$ will be explained.

Theorem 8 (Refer to the Above-Mentioned Reference 1)

In the Tanner graph expression of a quasi-cyclic matrix $H_{QC}$, the necessary and sufficient conditions which make the quasi-cyclic matrix satisfy $g \geq 10$ is that the equations (5) and (30) are established and the following equation (34) is established.

[Equation 49]

$$p_{j_0,l_0} - p_{j_1,l_0} + p_{j_1,l_1} - p_{j_2,l_1} + p_{j_2,l_2} - p_{j_3,l_2} + p_{j_3,l_3} - p_{j_0,l_3} \not\equiv 0 \pmod{p} \text{ for } j_0 \neq j_1, j_1 \neq j_2, j_2 \neq j_3, l_0 \mathbf{16} \, l_1, l_1 \neq l_2, l_2 \neq l_3. \quad (34)$$

A check matrix $H_{QC}^{(i)}$ is defined as follows.

$$H_{QC}^{(i)} = (I(p_{j,l}^{(i)}))_{0 \leq j \leq J-1, 0 \leq l \leq L_i-1}$$

$$0 \leq p^{(i)} \leq L_i - 1 \quad \text{[Equation 50]}$$

The check matrix $H_{QC}^{(i)}$ has a girth satisfying $g \geq 10$, the following relationship holds: $p_i \geq L_i$, and $p_i$ is a natural number. Moreover, a new check matrix $H_{QC}^{(1,2)}$ is defined as follows.

$$H_{QC}^{(1,2)} = (I(p_{j,l}^{(1,2)}))_{0 \leq j \leq J-1, 0 \leq l \leq L_1 L_2 - 1} \quad \text{[Equation 51]}$$

The following equation (35) is defined for the following relationships: $0 \leq j \leq J-1$, $0 \leq q \leq L_1-1$, and $0 \leq r \leq L_2-1$.

[Equation 52]

$$p_{j,qL_2+r}^{(1,2)} = p_{j,q}^{(1)} p_2 p_{j,r}^{(2)} \quad (35)$$

Theorem 9

In a case of i=1, 2, or ..., when all the $p_i J \times p_i L_i$ check matrices have a girth satisfying $g \geq 10$, there exists a $(p_1 p_2 \ldots) J \times (p_1 p_2 \ldots)(L_1 L_2 \ldots)$ check matrix having a girth satisfying $g \geq 8$, there exists no $(p_1 p_2 \ldots) J \times (p_1 p_2 \ldots)(L_1 L_2 \ldots)$ check matrix having a girth satisfying $g \geq 10$.

Hereafter, it will be proved that the theorem 9 is correct.

It can be drawn promptly from the theorem 6 that there exists a $(p_1 p_2 \ldots) J \times (p_1 p_2 \ldots)(L_1 L_2 \ldots)$ check matrix having a girth g=8.

Whether or not this check matrix has a girth satisfying $g \geq 10$ is examined.

In this case, when the following equation is defined: $l_i = q_i L_2 + r_i$, and it can be verified that the following equations (36), (37) and (38) are established from the conditional expressions for $g \geq 10$, the $(p_1 p_2 \ldots) J \times (p_1 p_2 \ldots)(L_1 L_2 \ldots)$ check matrix also has a girth satisfying $g \geq 10$.

[Equation 53]

$$d_1^a p_2 + d_2^a \neq 0 \pmod{p = p_1 p_2} \quad (36)$$

$$d_1^b p_2 + d_2^b \neq 0 \pmod{p = p_1 p_2} \quad (37)$$

$$d_1^c p_2 + p_2^c \neq 0 \pmod{p = p_1 p_2} \quad (38)$$

First, the following equation holds.

[Equation 54]

$$d_1^a = p_{j_0,q_0}^{(1)} - p_{j_1,q_0}^{(1)} + p_{j_1,q_1}^{(1)} - p_{j_0,q_1}^{(1)}$$

$$d_2^a = p_{j_0,r_0}^{(2)} - p_{j_1,r_0}^{(2)} + p_{j_1,r_1}^{(2)} - p_{j_0,r_1}^{(2)}$$

$$d_1^b = p_{j_0,q_0}^{(1)} - p_{j_1,q_0}^{(1)} + p_{j_1,q_1}^{(1)} - p_{j_2,q_1}^{(1)} + p_{j_2,q_2}^{(1)} - p_{j_0,q_2}^{(1)}$$

$$d_2^b = p_{j_0,r_0}^{(2)} - p_{j_1,r_0}^{(2)} + p_{j_1,r_1}^{(2)} - p_{j_2,r_1}^{(2)} + p_{j_2,r_2}^{(2)} - p_{j_0,r_2}^{(2)}$$

$$d_1^c = p_{j_0,q_0}^{(1)} - p_{j_1,q_0}^{(1)} + p_{j_1,q_1}^{(1)} - p_{j_2,q_1}^{(1)} + p_{j_2,q_2}^{(1)} - p_{j_3,q_2}^{(1)} + p_{j_3,q_3}^{(1)} - p_{j_0,q_3}^{(1)}$$

$$d_2^c = p_{j_0,r_0}^{(2)} - p_{j_1,r_0}^{(2)} + p_{j_1,r_1}^{(2)} - p_{j_2,r_1}^{(2)} + p_{j_2,r_2}^{(2)} - p_{j_3,r_2}^{(2)} + p_{j_3,r_3}^{(2)} - p_{j_0,r_3}^{(2)}$$

Furthermore, it can be verified from the proof of the theorem 6 that the equations (36) and (37) hold.

At this time, because the following relationships hold: $j_0 \neq j_1$ and $l_0 \neq l_1$, the following condition holds: $q_0 \neq q_1$ or $r_0 \neq r_1$.

Furthermore, it is clear from the theorem 8 that the conditions: $j_0 \neq j_1$, $j_1 \neq j_2$, and $j_2 \neq j_3$ include the combination of $j_0 \neq j_2$ and $j_1 = j_3$.

In this case, when the following relationships are defined: $l_0 = q_0 L_2 + r_0$, $l_1 = q_0 L_2 + r_1$, $l_2 = q_1 L_2 + r_1$, and $l_3 = q_1 L_2 + r_0$, the equation (34) is as shown below and the theorem 8 is not satisfied.

Therefore, it is verified that there exists no $(p_1 p_2 \ldots) J \times (p_1 p_2 \ldots)(L_1 L_2 \ldots)$ check matrix having a girth satisfying $g \geq 10$, it is proved that the theorem 9 is correct.

[Equation 55]

$$p_{j_0,l_0} - p_{j_1,l_0} + p_{j_1,l_1} -$$

$$p_{j_2,l_1} + p_{j_2,l_2} - p_{j_3,l_2} + p_{j_3,l_3} - p_{j_0,l_3} =$$

$$p_{j_0,l_0} - p_{j_1,l_0} + p_{j_1,l_1} - p_{j_0,l_1} + p_{j_0,l_2} - p_{j_1,l_2} + p_{j_1,l_3} -$$

$$p_{j_0,l_3} = (p_{j_0,q_0}^{(1)} \cdot p_2 + p_{j_0,r_0}^{(2)}) - (p_{j_1,q_0}^{(1)} \cdot p_2 + p_{j_1,r_0}^{(2)}) +$$

$$(p_{j_1,q_0}^{(1)} \cdot p_2 + p_{j_1,r_1}^{(2)}) - (p_{j_0,q_0}^{(1)} \cdot p_2 + p_{j_0,r_1}^{(2)}) +$$

$$(p_{j_0,q_1}^{(1)} \cdot p_2 + p_{j_0,r_1}^{(2)}) - (p_{j_1,q_1}^{(1)} \cdot p_2 + p_{j_1,r_1}^{(2)}) +$$

$$(p_{j_1,q_1}^{(1)} \cdot p_2 + p_{j_1,r_0}^{(2)}) - (p_{j_0,q_1}^{(1)} \cdot p_2 + p_{j_0,r_0}^{(2)}) =$$

$$(p_{j_0,q_0}^{(1)} - p_{j_1,q_0}^{(1)}) \cdot p_2 + (p_{j_0,r_0}^{(2)} - p_{j_1,r_0}^{(2)}) +$$

$$(p_{j_1,q_0}^{(1)} - p_{j_0,q_0}^{(1)}) \cdot p_2 + (p_{j_1,r_1}^{(2)} - p_{j_0,r_1}^{(2)}) +$$

$$(p_{j_0,q_1}^{(1)} - p_{j_1,q_1}^{(1)}) \cdot p_2 + (p_{j_0,r_1}^{(2)} - p_{j_1,r_1}^{(2)}) +$$

$$(p_{j_1,q_1}^{(1)} - p_{j_0,q_1}^{(1)}) \cdot p_2 + (p_{j_1,r_0}^{(2)} - p_{j_0,r_0}^{(2)}) = 0$$

Next, a design method for $g \geq 10$ will be explained.

An example showing a conditional expression which does not satisfy the equation (34) used for the proof of the theorem 9 will be specified.

The following matrix has been verified to have a girth satisfying $g \geq 10$ at $p_1 = p_2$.

[Equation 56]

$$H_{QC}^{(1)} = H_{QC}^{(2)} = \begin{bmatrix} I(0) & I(0) \\ I(0) & I(1) \\ I(0) & I(3) \end{bmatrix}$$

Therefore, the quasi-cyclic matrix $H_{QC}$ is given at $p = p_1 p_2 = 49$ as follows.

[Equation 57]

$$H_{QC} = H_{QC}^{(1,2)} = \begin{bmatrix} I(0) & I(0) & I(0) & I(0) \\ I(0) & I(1) & I(7) & I(8) \\ I(0) & I(3) & I(21) & I(24) \end{bmatrix}$$

The conditional expression which does not satisfy the equation (34) used for the proof of the theorem 9 is defined as a matrix consisting of a combination as shown below when the conditional expression is expressed in figure form.

[Equation 58]

$$H_{QC}^{(1,2)} = \begin{bmatrix} I(0) & I(0) & I(0) & I(0) \\ I(0) & I(1) & I(7) & I(8) \\ I(0) & I(3) & I(21) & I(24) \end{bmatrix}$$

Concretely, the conditional expression is defined as follows.

[Equation 59]

$$p_{j_0,l_0} - p_{j_1,l_0} + p_{j_1,l_1} -$$

$$p_{j_2,l_1} + p_{j_2,l_2} - p_{j_3,l_2} + p_{j_3,l_3} - p_{j_0,l_3} =$$

$$p_{j_0,l_0} - p_{j_1,l_0} + p_{j_1,l_1} - p_{j_0,l_1} + p_{j_0,l_2} - p_{j_1,l_2} + p_{j_1,l_3} -$$

$$p_{j_0,l_3} = (p_{j_0,q_0}^{(1)} \cdot p_2 + p_{j_0,r_0}^{(2)}) - (p_{j_1,q_0}^{(1)} \cdot p_2 + p_{j_1,r_0}^{(2)}) +$$

$$(p_{j_1,q_0}^{(1)} \cdot p_2 + p_{j_1,r_1}^{(2)}) - (p_{j_0,q_0}^{(1)} \cdot p_2 + p_{j_0,r_1}^{(2)}) +$$

$$(p_{j_0,q_1}^{(1)} \cdot p_2 + p_{j_0,r_1}^{(2)}) - (p_{j_1,q_1}^{(1)} \cdot p_2 + p_{j_1,r_1}^{(2)}) +$$

$$(p_{j_1,q_1}^{(1)} \cdot p_2 + p_{j_1,r_0}^{(2)}) - (p_{j_0,q_1}^{(1)} \cdot p_2 + p_{j_0,r_0}^{(2)}) =$$

$$(p_{j_0,q_0}^{(1)} - p_{j_1,q_0}^{(1)}) \cdot p_2 + (p_{j_0,r_0}^{(2)} - p_{j_1,r_0}^{(2)}) +$$

$$(p_{j_0,q_0}^{(1)} - p_{j_1,q_0}^{(1)}) \cdot p_2 + (p_{j_0,r_1}^{(2)} - p_{j_1,r_1}^{(2)}) +$$

$$(p_{j_0,q_1}^{(1)} - p_{j_1,q_1}^{(1)}) \cdot p_2 + (p_{j_0,r_1}^{(2)} - p_{j_1,r_1}^{(2)}) +$$

$$(p_{j_1,q_1}^{(1)} - p_{j_0,q_1}^{(1)}) \cdot p_2 + (p_{j_1,r_0}^{(2)} - p_{j_0,r_0}^{(2)}) =$$

-continued
$$0 = (0-0) \cdot 7 + (0-0) + (0-0) \cdot 7 + (1-0) +$$
$$(0-1) \cdot 7 + (0-1) + (1-0) \cdot 7 + (0-0) = 0$$

Furthermore, when a pattern of g=8 is expressed by a combination of $p_{j,q}^{(1)}$ and $p_{j,r}^{(2)}$ in such a way as to be easy to understand, the pattern is given as follows and the following relationships hold: $d_1^c=0$ and $d_2^c=0$.

[Equation 60]

$$P_{j,q}^{(1)} = \begin{bmatrix} 0 & 0 & 0 & 0 \\ 0 & 0 & & 1 \\ 0 & 0 & 3 & 3 \end{bmatrix}$$

$$P_{j,r}^{(2)} = \begin{bmatrix} 0 & 0 & 0 & 0 \\ 0 & & 1 & \\ 0 & 3 & 0 & 3 \end{bmatrix}$$

For two arbitrary rows, this pattern configures loop 8 between two columns within a submatrix on a left side having the same size as the check matrix $H_{QC}^{(2)}$, and two columns in another submatrix.

Therefore, what is necessary is just to perform the design in such a way that this type of loop 8 does not occur.

Concretely, when the check matrix $H_{QC}^{(1,2)}$ is generated from the check matrix $H_{QC}^{(1)}$ and the check matrix $H_{QC}^{(2)}$, a portion of the matrix other than the submatrix on the left-hand side having the same size as the check matrix $H_{QC}^{(2)}$ is masked, and a matrix which avoids loop 4 within this "portion of the matrix other than the submatrix on the left-hand side" is generated. For example, the following check matrix $H_{QC}^{(1,2)}$ is generated.

$$H_{QC}^{(1,2)} = \begin{bmatrix} I(0) & I(0) & I(0) & 0 \\ I(0) & I(1) & 0 & I(8) \\ I(0) & I(3) & I(21) & I(24) \end{bmatrix},$$ [Equation 61]

$$p = p_1 p_2 = 7 * 7 = 49$$

As a result, the above-mentioned type of loop 8 does not occur. Therefore, the following relationship holds: $g \geq 10$. This $H_{QC}^{(1,2)}$ can be used as the check matrix just as it is. Furthermore, by repeating this process recursively for the plural numbers i, a $(p_1 p_2 \ldots) J \times (p_1 p_2 \ldots)(L_1 L_2 \ldots)$ check matrix having a girth satisfying $g \geq 10$ can be configured.

In addition, at a position of a zero matrix within the check matrix $H_{QC}^{(1,2)}$, a cyclic permutation matrix $I(p_{j,l})$ which satisfies the condition $g \geq 10$ is found through a search.

For example, the following check matrix $H_{QC}^{(1,2)}$ has a girth satisfying $g \geq 10$.

$$H_{QC}^{(1,2)} = \begin{bmatrix} I(0) & I(0) & I(0) & I(44) \\ I(0) & I(1) & I(43) & I(8) \\ I(0) & I(3) & I(21) & I(24) \end{bmatrix},$$ [Equation 62]

$$P = P_1 P_2 = 7 * 7 = 49$$

Hereinafter, the same processes as those in the design methods for $g \geq 6$ and $g \geq 8$ will be carried out.

The following check matrix $H_{QC}^{(1,2)}$ also has a girth satisfying $g \geq 10$.

$$H_{QC}^{(1,2)} = \begin{bmatrix} I(0) & I(0) & I(44) & I(0) & 0 & 0 \\ I(1) & I(43) & I(8) & I(0) & I(0) & 0 \\ I(3) & I(21) & I(24) & 0 & I(0) & I(0) \end{bmatrix},$$ [Equation 63]

$$P = P_1 P_2 = 7 * 7 = 49$$

Embodiment 4

In this Embodiment 4, another method of forming a check matrix satisfying $g \geq 10$ will be shown.

First, a check matrix $H_{QC}^{(1)}$ is defined as follows.
[Equation 64]

$$H_{QC}^{(1)} = (I(p_{j,l}^{(1)}))_{0 \leq j \leq J-1, 0 \leq l \leq L_1-1}$$

$$0 \leq p_1 \leq L_1 - 1 \quad (39)$$

Furthermore, the check matrix $H_{QC}^{(1)}$ has a girth satisfying $g \geq 10$, the following relationship holds: $p_1 \geq L_1$, and $p_1$ is a natural number.

Similarly, a check matrix $H_{QC}^{(a)}$ is defined as follows.
[Equation 65]

$$H_{QC}^{(a)} = (I(p_{j,l}^{(a)}))_{0 \leq j \leq J-1, 0 \leq l \leq L_2-1}$$

$$0 \leq p_a \leq L_a - 1 \quad (40)$$

Furthermore, the check matrix $H_{QC}^{(a)}$ has a girth satisfying $g \geq 10$, the following relationship holds: $p_a \geq L_a$, and $p_a$ is a natural number.

Next, generate a plurality of matrices $H_{QC}^{(i)} = (I(p_{j,r}^{(i)}))$, $i=2, 3, \ldots$ which do not include two or more identical columns from the check matrix $H_{QC}^{(a)}$ given by the equation (40).

Moreover, a new check matrix $H_{QC}^{(1,2,3,\ldots)}$ is defined as follows.

$$H_{QC}^{(1,2,\ldots)} = (I(p_{j,l}^{(1,2,\ldots)}))_{0 \leq j \leq J-1, 0 \leq l \leq L-1}, p = p_1 p_1 \quad \text{[Equation 66]}$$

Furthermore, the following equation (41) is defined for $$0 \leq j \leq J-1, 0 \leq q \leq L_1-1, 0 \leq r^{(2)} \leq L_2-1, 0 \leq r^{(3)} \leq L_3-1,$$
and ...

[Equtaion 67]

$$p_{j,\hat{l}} = \begin{cases} p_{j,q}^{(1)} p_a + p_{j,r^{(2)}}^{(2)} & \text{if } q = 0, \\ p_{j,q}^{(1)} p_a + p_{j,r^{(3)}}^{(3)} & \text{if } q = 1, \\ p_{j,q}^{(1)} p_a + p_{j,r^{(4)}}^{(4)} & \text{if } q = 2, \\ \vdots & \vdots \end{cases} \quad (41)$$

where $$\hat{l} = \begin{cases} qL_2 + r^{(2)} & \text{if } q = 0, \\ qL_3 + r^{(3)} & \text{if } q = 1, \\ qL_4 + r^{(4)} & \text{if } q = 2, \\ \vdots & \vdots \end{cases} \quad (42)$$

Also in the combination shown by [Equation 58], this $H_{QC}^{(1,2,3,\cdots)}$ can satisfy the equation (34) and has a girth satisfying $g \geq 10$.

Next, an example will be shown.

$$H_{QC}^{(1)} = H_{QC}^{(a)} = \begin{bmatrix} I(0) & I(0) & I(0) \\ I(0) & I(2) & I(3) \\ I(0) & I(6) & I(14) \end{bmatrix},$$ [Equation 68]

$$p_1 = p_a = 23, L_1 = L_a = 3.$$

Furthermore, the following matrices are formed, as the plurality of matrices which do not include two or more identical columns, by using $H_{QC}^{(a)}$ $$H_{QC}^{(2)} = \begin{bmatrix} I(0) & I(0) \\ I(0) & I(2) \\ I(0) & I(6) \end{bmatrix}, H_{QC}^{(3)} = \begin{bmatrix} I(0) & I(0) \\ I(0) & I(3) \\ I(0) & I(14) \end{bmatrix}, H_{QC}^{(4)} = \begin{bmatrix} I(0) & I(0) \\ I(2) & I(3) \\ I(6) & I(14) \end{bmatrix},$$

$$L_2 = L_3 = L_4 = 2.$$

The following check matrix is farmed by using these matrices.

$$H_{QC}^{(1,2,3,4)} = \begin{bmatrix} I(0) & I(0) & I(0) & I(0) & I(0) & I(0) \\ I(0) & I(2) & I(46) & I(49) & I(71) & I(72) \\ I(0) & I(6) & I(138) & I(152) & I(328) & I(336) \end{bmatrix},$$

$$p = p_1 p_a = 23 * 23 = 529.$$

This check matrix $H_{QC}^{(1,2,3,4)}$ has a girth satisfying $g \geq 10$.

Hereinafter, the processes which are the same as those in the designing methods for $g \geq 6$ and $g \geq 8$.

The following check matrix $\overline{H}_{QC}^{(1,2,3,4)}$ also has a girth satisfying $g \geq 10$.

$$\overline{H}_{QC}^{(1,2,3,4)} = \begin{bmatrix} I(0) & I(0) & I(0) & I(0) & I(0) & I(0) & 0 & 0 \\ I(2) & I(46) & I(49) & I(71) & I(72) & I(0) & I(0) & 0 \\ I(6) & I(138) & I(152) & I(328) & I(336) & 0 & I(0) & I(0) \end{bmatrix}.$$

Embodiment 5

In above-mentioned Embodiments 1 to 3, the example in which the transmitter 1 and the receiver 2 are connected to each other via the channel 3 is shown. As an alternative, the transmitter 1 and the receiver 2 can be connected to each other via a radio channel.

Figure 5:
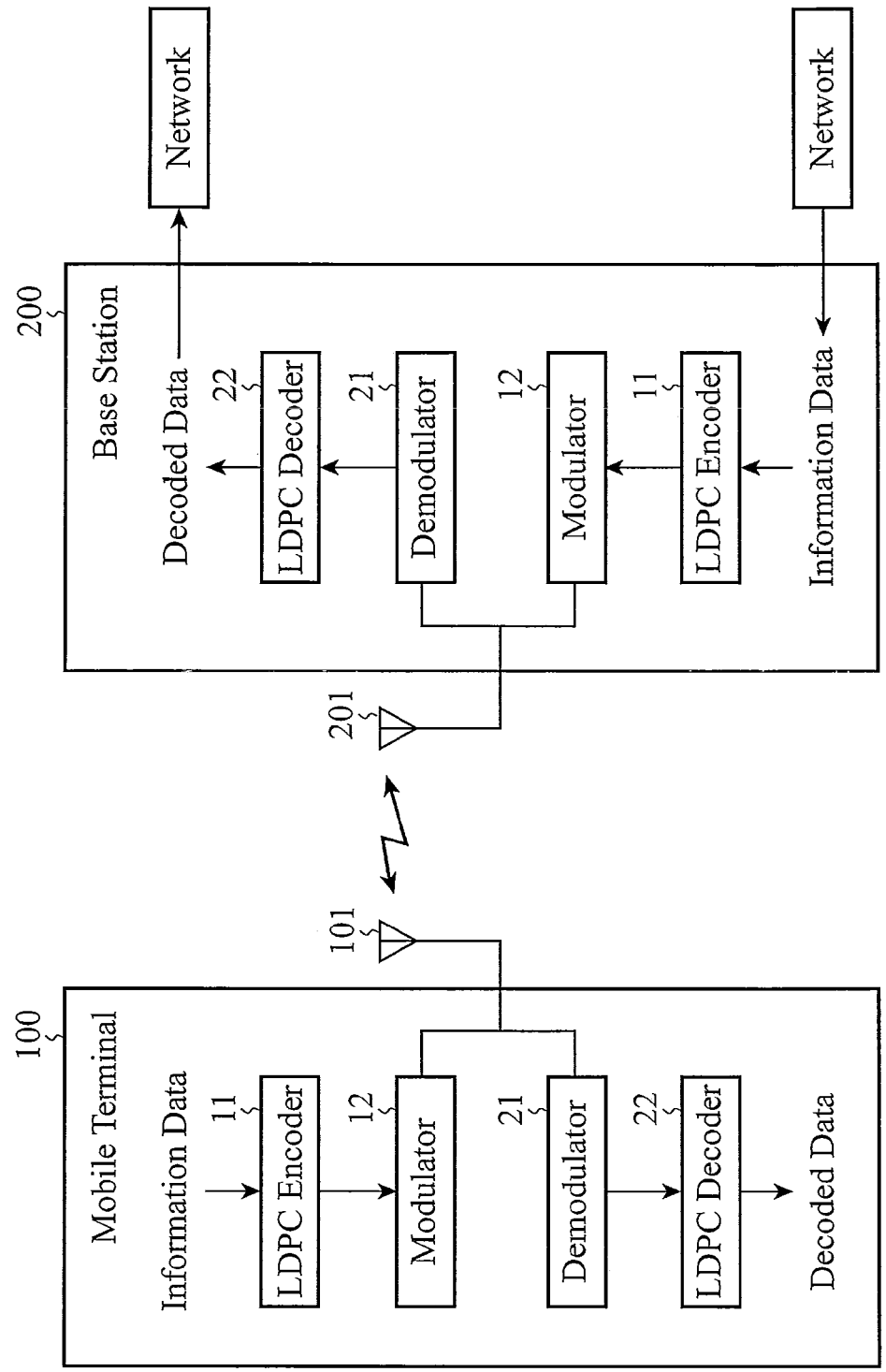
FIG. 5 is an explanatory drawing showing an example in which a mobile terminal 100 is connected to a base station 200 via a wireless channel.
Figures 6, 7:
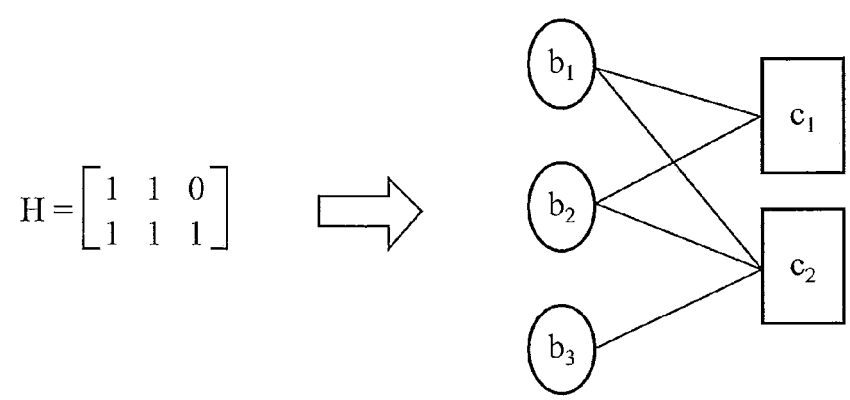
FIG. 6 is an explanatory drawing showing a parity check matrix for QC code.
FIG. 7 is an explanatory drawing showing an example of the check matrix expressed in a form of a Tanner graph.

FIG. 5 shows an example in which a mobile terminal 100 a base station 200 are connected to each other via a radio channel. Each of the mobile terminal 100 and the base station 200 is provided with a transmitter 1 (an LDPC encoder 11 and a modulator 12) and a receiver 2 (a demodulator 21 and an LDPC decoder 22).

Reference numeral 101 denotes an antenna of the mobile terminal 100, and reference numeral 201 denotes an antenna of the base station 200.

For example, when the mobile terminal 100 transmits data to the base station 200, the LDPC encoder 11 of the mobile terminal 100 generates a codeword from the data which is the target for transmission (encodes the data in units of a packet), and the modulator 12 of the mobile terminal 100 modulates the codeword and sends out the modulated signal onto a radio channel via the antenna 101, in the same way that those in accordance with each of above-mentioned Embodiments 1 and 2 do.

When the antenna 201 receives the modulated signal (the signal including an error occurring during transmission via the radio channel) transmitted from the mobile terminal 100, the demodulator 21 of the base station 200 demodulates the modulated signal to output the codeword to the LDPC decoder 22.

When receiving the codeword from the demodulator 21, the LDPC decoder 22 of the base station 200 carries out the same decoding processing as that in each of above-mentioned Embodiments 1 and 2 so as to decode the codeword into the data which is the target for transmission and then transfer this data to a communication destination not shown via a network.

When decoding the codeword into the data which is the target for transmission, the LDPC decoder 22 performs an error correction on the data in units of a packet and notifies whether it has succeeded in performing the error correction to an upper layer.

In contrast, in a case in which the base station 200 transmits data to the mobile terminal 100, when receiving the data which is the target for transmission from a sender not shown, the LDPC encoder 11 of the base station 200 generates a codeword from the data which is the target for transmission (encodes the data in units of a packet), the modulator 12 of the base station 200 modulates the codeword and sends out the modulated signal onto the radio channel via the antenna 201, in the same way that that according to each of above-mentioned Embodiments 1 and 2 does.

When the antenna 101 receiving the modulated signal (the signal including an error occurring during transmission via the radio channel) transmitted from the base station 200, the demodulator 21 of the mobile terminal 100 demodulates to the modulated signal and outputs the codeword to the LDPC decoder 22.

When receiving the codeword from the demodulator 21, the LDPC decoder 22 of the mobile terminal 100 carries out the same decoding processing as that in each of above-mentioned Embodiments 1 and 2 so as to decode the codeword into the data which is the target for transmission.

When decoding the codeword into the data which is the target for transmission, the LDPC decoder 22 performs an error correction on the data in units of a packet and notifies whether it has succeeded in performing the error correction to an upper layer.

INDUSTRIAL APPLICABILITY

As mentioned above, in the check matrix generating device, the check matrix generating method, the encoder, the transmitter, the decoder, and the receiver in accordance with the present invention, when generating a regular quasi-cyclic matrix, the quasi-cyclic matrix generating means configures the regular quasi-cyclic matrix by combining cyclic permutation matrices in each of which matrix elements whose row number is r ($0 \leq r \leq p-1$) and whose column number is $(r+p_{j,i})$ mod p are "1"s, and the other matrix elements are "0"s in such a way that a plurality of cyclic permutation matrices arranged in a specific row differ from one another. Therefore, the present invention is suitable, as an encoding system, for use in a check matrix generating device, a check matrix generating method, an encoder, a transmitter, a decoder, a receiver, and so on in a communications system which uses LDPC codes.

The invention claimed is:

1. A check matrix generating device provided with a quasi-cyclic matrix generating means for arranging J cyclic permutation matrices $I(p_{j,l})$ with p rows and q columns ($0 \leq j \leq J-1$, $0 \leq l \leq L-1$) in a row direction and also arranging L cyclic permutation matrices $I(p_{j,l})$ in a column direction so as to generate a regular quasi-cyclic matrix having uniform row and column weights, a mask matrix generating means for generating a mask matrix which can adapt to a plurality of coding rates, a masking means for converting a specific cyclic permutation matrix within the regular quasi-cyclic matrix generated by said quasi-cyclic matrix generating means by using the mask matrix generated by said mask matrix generating means into a zero matrix so as to generate an irregular masked quasi-cyclic matrix, and a parity check matrix generating means for placing both the masked quasi-cyclic matrix generated by said masking means, and a matrix in which said cyclic permutation matrices are arranged in a stair-step shape at predetermined positions respectively so as to generate an irregular parity check matrix for LDPC code, wherein said quasi-cyclic matrix generating means configures the regular quasi-cyclic matrix by combining cyclic permutation matrices in each of which matrix elements whose row number is r ($0 \leq r \leq p-1$) and whose column number is $(r+p_{j,l})$ mod p are "1"s, and other matrix elements are "0"s, and a plurality of cyclic permutation matrices arranged at a specific row differ from one another.

2. The check matrix generating device according to claim 1, wherein in a case in which the number of cyclic permutation matrices arranged in the row direction is J and the number of cyclic permutation matrices arranged in the column direction is L, when J is equal to or larger than L, p which is a size of each cyclic permutation matrix is equal to or larger than J, a cyclic permutation matrix with j rows and l columns is $p_{j,l}=j \cdot (p_{1,l} \pmod p))$ for each cyclic permutation matrix, the quasi-cyclic matrix generating means generates the quasi-cyclic matrix in which all cyclic permutation matrices $p_{1,l}$ differ from one another in each column at $0 \leq p_{1,l} \leq p-1$.

3. The check matrix generating device according to claim 1, wherein in a case in which the quasi-cyclic matrix generating means places a zero matrix at a 0th row, the number of cyclic permutation matrices arranged in the row direction is J and the number of cyclic permutation matrices arranged in the column direction is L+1, when J is equal to or larger than L+1, p which is a size of each cyclic permutation matrix is equal to or larger than J, a cyclic permutation matrix with j rows and l columns is $p_{j,l}=j \cdot (p_{1,l} \pmod p))$ for each cyclic permutation matrix, the quasi-cyclic matrix generating means generates the quasi-cyclic matrix in which all cyclic permutation matrices $p_{1,l}$ differ from one another in each column at $0 \leq p_{1,l} \leq p-1$.

4. The check matrix generating device according to claim 1, wherein the quasi-cyclic matrix generating means configures a check matrix $H_{QC}^{(1,2)}$, as the regular quasi-cyclic matrix, from a $p_1 J \times p_1 L_1$ check matrix $H_{QC}^{(1)}$ whose girth is six or more and a $p_2 J \times p_2 L_2$ check matrix $H_{QC}^{(2)}$ whose girth is six or more.

5. The check matrix generating device according to claim 4, wherein the quasi-cyclic matrix generating means configures a check matrix $H_{QC}^{(1,2,3)}$, as the regular quasi-cyclic matrix, from a $p_3 J \times p_3 L_3$ check matrix $H_{QC}^{(3)}$ whose girth is six or more and the check matrix $H_{QC}^{(1,2)}$.

6. The check matrix generating device according to claim 5, wherein the quasi-cyclic matrix generating means configures a check matrix $H_{QC}^{(1,2,3,4,5,6,\ldots)}$, as the regular quasi-cyclic matrix, from a $p_k J \times p_k L_k$ check matrix $H_{QC}^{(k)}$ (k=4,5, 6, . . .) whose girth is six or more and the check matrix $H_{QC}^{(1,2,3)}$.

7. The check matrix generating device according to claim 1, wherein the quasi-cyclic matrix generating means configures a check matrix $H_{QC}^{(1,2)}$, as the regular quasi-cyclic matrix, from a $p_1 J \times p_1 L_1$ check matrix $H_{QC}^{(1)}$ whose girth is eight or more and a $p_2 J \times p_2 L_2$ check matrix $H_{QC}^{(2)}$ whose girth is eight or more.

8. The check matrix generating device according to claim 7, wherein the quasi-cyclic matrix generating means configures a check matrix $H_{QC}^{(1,2,3)}$, as the regular quasi-cyclic matrix, from a $p_3 J \times p_3 L_3$ check matrix $H_{QC}^{(3)}$ whose girth is eight or more and the check matrix $H_{QC}^{(1,2)}$.

9. The check matrix generating device according to claim 8, wherein the quasi-cyclic matrix generating means configures a check matrix $H_{QC}^{(1,2,3,4,5,6,\ldots)}$, as the regular quasi-cyclic matrix, from a $p_k J \times p_k L_k$ check matrix $H_{QC}^{(k)}$ (k=4, 5, 6, . . . ) whose girth is eight or more and the check matrix $H_{QC}^{(1,2,3)}$.

10. The check matrix generating device according to claim 1, wherein the quasi-cyclic matrix generating means configures a check matrix $H_{QC}^{(1,2)}$, as the regular quasi-cyclic matrix, from a $p_1 J \times p_1 L_1$ check matrix $H_{QC}^{(1)}$ whose girth is ten or more and a $p_2 J \times p_2 L_2$ check matrix $H_{QC}^{(2)}$ whose girth is ten or more, and, when configuring said check matrix $H_{QC}^{(1,2)}$, masks matrices other than a submatrix on a left side having a same size as said check matrix $H_{QC}^{(2)}$.

11. The check matrix generating device according to claim 10, wherein the quasi-cyclic matrix generating means searches for a cyclic permutation matrix $I(p_{j,l})$ which satisfies a condition that a girth is ten or more in a zero matrix within the check matrix $H_{QC}^{(1,2)}$.

12. A check matrix generating method including a quasi-cyclic matrix generating step of a quasi-cyclic matrix generating means arranging J cyclic permutation matrices $I(p_{j,l})$ with p rows and q columns ($0 \leq j \leq J-1$, $0 \leq l \leq L-1$) in a row direction and also arranging L cyclic permutation matrices $I(p_{j,l})$ in a column direction so as to generate a regular quasi-cyclic matrix having uniform row and column weights, a mask matrix generating step of a mask matrix generating means generating a mask matrix which can adapt to a plurality of coding rates, a masking step of a masking means converting a specific cyclic permutation matrix within the regular quasi-cyclic matrix generated by said quasi-cyclic matrix generating means by using the mask matrix generated by said mask matrix generating means into a zero matrix so as to generate an irregular masked quasi-cyclic matrix, and a parity check matrix generating step of a parity check matrix generating means placing both the masked quasi-cyclic matrix generated by said masking means, and a matrix in which said cyclic permutation matrices are arranged in a stair-step shape at predetermined positions respectively so as to generate an irregular parity check matrix for LDPC code, wherein said quasi-cyclic matrix generating means configures the regular quasi-cyclic matrix by combining cyclic permutation matrices in each of which matrix elements whose row number is r ($0 \leq r \leq p-1$) and whose column number is $(r+p_{j,l})$ mod p are "1", and other matrix elements are "0"s, and a plurality of cyclic permutation matrices arranged at a specific row differ from one another.

13. An encoder provided with a quasi-cyclic matrix generating means for arranging J cyclic permutation matrices $I(p_{j,l})$ with p rows and q columns ($0 \leq j \leq J-1$, $0 \leq l \leq L-1$) in a row direction and also arranging L cyclic permutation matrices $I(p_{j,l})$ in a column direction so as to generate a regular quasi-cyclic matrix having uniform row and column weights, a mask matrix generating means for generating a mask matrix which can adapt to a plurality of coding rates, a masking means for converting a specific cyclic permutation matrix within the regular quasi-cyclic matrix generated by said quasi-cyclic matrix generating means by using the mask matrix generated by said mask matrix generating means into a zero matrix so as to generate an irregular masked quasi-cyclic matrix, a parity check matrix generating means for placing both the masked quasi-cyclic matrix generated by said masking means, and a matrix in which said cyclic permutation matrices are arranged in a stair-step shape at predetermined positions respectively so as to generate an irregular parity check matrix for LDPC code, and a codeword generating means for generating a codeword from a message which is a transmission object by using the parity check matrix generated by said parity check matrix generating means, wherein said quasi-cyclic matrix generating means configures the regular quasi-cyclic matrix by combining cyclic permutation matrices in each of which matrix elements whose row number is r ($0 \leq r \leq p-1$) and whose column number is $(r+p_{j,l})$ mod p are "1"s, and other matrix elements are "0"s, and a plurality of cyclic permutation matrices arranged at a specific row differ from one another.

14. A transmitter provided with a quasi-cyclic matrix generating means for arranging J cyclic permutation matrices $I(p_{j,l})$ with p rows and q columns ($0 \leq j \leq J-1$, $0 \leq l \leq L-1$) in a row direction and also arranging L cyclic permutation matrices $I(p_{j,l})$ in a column direction so as to generate a regular quasi-cyclic matrix having uniform row and column weights, a mask matrix generating means for generating a mask matrix which can adapt to a plurality of coding rates, a masking means for converting a specific cyclic permutation matrix within the regular quasi-cyclic matrix generated by said quasi-cyclic matrix generating means by using the mask matrix generated by said mask matrix generating means into a zero matrix so as to generate an irregular masked quasi-cyclic matrix, a parity check matrix generating means for placing both the masked quasi-cyclic matrix generated by said masking means, and a matrix in which said cyclic permutation matrices are arranged in a stair-step shape at predetermined positions respectively so as to generate an irregular parity check matrix for LDPC code, a codeword generating means for generating a codeword from a message which is a transmission object by using the parity check matrix generated by said parity check matrix generating means, and a modulating means for modulating the codeword generated by said codeword generating means to transmit a modulated signal, wherein said quasi-cyclic matrix generating means configures the regular quasi-cyclic matrix by combining cyclic permutation matrices in each of which matrix elements whose row number is r ($0 \leq r \leq p-1$) and whose column number is $(r+p_{j,l})$ mod p are "1"s, and other matrix elements are "0"s, and a plurality of cyclic permutation matrices arranged at a specific row differ from one another.

15. A decoder provided with a quasi-cyclic matrix generating means for arranging J cyclic permutation matrices $I(p_{j,l})$ with p rows and q columns ($0 \leq j \leq J-1$, $0 \leq l \leq L-1$) in a row direction and also arranging L cyclic permutation matrices $I(p_{j,l})$ in a column direction so as to generate a regular quasi-cyclic matrix having uniform row and column weights, a mask matrix generating means for generating a mask matrix which can adapt to a plurality of coding rates, a masking means for converting a specific cyclic permutation matrix within the regular quasi-cyclic matrix generated by said quasi-cyclic matrix generating means by using the mask matrix generated by said mask matrix generating means into a zero matrix so as to generate an irregular masked quasi-cyclic matrix, a parity check matrix generating means for placing both the masked quasi-cyclic matrix generated by said masking means, and a matrix in which said cyclic permutation matrices are arranged in a stair-step shape at predetermined positions respectively so as to generate an irregular parity check matrix for LDPC code, and a decoding means for decoding a codeword generated by an encoder into a message by using the parity check matrix generated by said parity check matrix generating means, wherein said quasi-cyclic matrix generating means configures the regular quasi-cyclic matrix by combining cyclic permutation matrices in each of which matrix elements whose row number is r ($0 \leq r \leq p-1$) and whose column number is $(r+p_{j,l})$ mod p are "1"s, and other matrix elements are "0"s, and a plurality of cyclic permutation matrices arranged at a specific row differ from one another.

16. A receiver provided with a quasi-cyclic matrix generating means for arranging J cyclic permutation matrices $I(p_{j,l})$ with p rows and q columns ($0 \leq j \leq J-1$, $0 \leq l \leq L-1$) in a row direction and also arranging L cyclic permutation matrices $I(p_{j,l})$ in a column direction to generate a regular quasi-cyclic matrix having uniform row and column weights, a mask matrix generating means for generating a mask matrix which can adapt to a plurality of coding rates, a masking means for converting a specific cyclic permutation matrix within the regular quasi-cyclic matrix generated by said quasi-cyclic matrix generating means by using the mask matrix generated by said mask matrix generating means into a zero matrix so as to generate an irregular masked quasi-cyclic matrix, a parity check matrix generating means for placing both the masked quasi-cyclic matrix generated by said masking means, and a matrix in which said cyclic permutation matrices are arranged in a stair-step shape at predetermined positions respectively so as to generate an irregular parity check matrix for LDPC code, a demodulating means for receiving a modulated signal transmitted from a transmitter, and for demodulating said modulated signal to output a codeword, and a decoding means for decoding the codeword outputted from said demodulating means into a message by using the parity check matrix generated by said parity check matrix generating means, wherein said quasi-cyclic matrix generating means configures the regular quasi-cyclic matrix by combining cyclic permutation matrices in each of which matrix elements whose row number is r ($0 \leq r \leq p-1$) and whose column number is $(r+p_{j,l})$ mod p are "1"s, and other matrix elements are "0"s, and a plurality of cyclic permutation matrices arranged at a specific row differ from one another.

17. A check matrix generating device characterized in comprising: a quasi-cyclic matrix generating means for arranging J cyclic permutation matrices $I(p_{j,l})$ with p rows and q columns ($0 \leq j \leq J-1$, $0 \leq l \leq L-1$) in a row direction and also arranging L cyclic permutation matrices $I(p_{j,l})$ in a column direction so as to generate a regular quasi-cyclic matrix having uniform row and column weights; a mask matrix generating means for generating a mask matrix which can adapt to a plurality of coding rates; a masking means for converting a specific cyclic permutation matrix within the regular quasi-cyclic matrix generated by said quasi-cyclic matrix generating means by using the mask matrix generated by said mask matrix generating means into a zero matrix so as to generate an irregular masked quasi-cyclic matrix; and a parity check matrix generating means for placing both the masked quasi-cyclic matrix generated by said masking means, and a matrix in which said cyclic permutation matrices are arranged in a stair-step shape at predetermined positions respectively so as to generate an irregular parity check matrix for LDPC code.

* * * * *